US008089823B2

(12) United States Patent
Sutardja et al.

(10) Patent No.: US 8,089,823 B2
(45) Date of Patent: *Jan. 3, 2012

(54) PROCESSOR INSTRUCTION CACHE WITH DUAL-READ MODES

(75) Inventors: Sehat Sutardja, Los Altos Hills, CA (US); Jason T. Su, Los Altos, CA (US); Hong-Yi Chen, Fremont, CA (US); Jason Sheu, Cupertino, CA (US); Jensen Tjeng, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 12/868,341

(22) Filed: Aug. 25, 2010

(65) Prior Publication Data

US 2010/0329058 A1 Dec. 30, 2010

Related U.S. Application Data

(63) Continuation of application No. 11/870,833, filed on Oct. 11, 2007, now Pat. No. 7,787,324.

(60) Provisional application No. 60/829,438, filed on Oct. 13, 2006.

(51) Int. Cl.
*G11C 8/00* (2006.01)

(52) U.S. Cl. ............... 365/230.06; 365/230.09; 365/203; 365/204

(58) Field of Classification Search ............. 365/230.06, 365/230.09, 203, 204; 711/104
See application file for complete search history.

(56) References Cited

U.S. PATENT DOCUMENTS 5,848,015 A * 12/1998 Seno ............................. 365/203
5,848,415 A    12/1998 Guck
5,942,284 A     8/1999 Hiskes et al.
(Continued)

FOREIGN PATENT DOCUMENTS

EP    A-0 427 425    5/1991
(Continued)

OTHER PUBLICATIONS

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 531 pages.
(Continued)

*Primary Examiner* — Tuan Nguyen
*Assistant Examiner* — Lance Reidlinger

(57) ABSTRACT

A processor including a memory and a control module. The memory has an array of cells. The control module is configured to: determine a number of access cycles along a first word line; determine an extended period based on the number of the access cycles; generate a word line signal to maintain the first word line in an activated state during (i) an initial period and (ii) the extended period; and access a first cell during the extended period. The first cell is connected to the first word line. The control module is further configured to deactivate the word line and maintain the first word line in a deactivated state while accessing a second cell connected to the first word line. The accessing of the second cell is based on a bit line separation provided during the extended period.

19 Claims, 12 Drawing Sheets

U.S. PATENT DOCUMENTS

| | | | |
|---|---|---|---|
| 5,943,284 | A | 8/1999 | Mizuno et al. |
| 7,460,432 | B2 | 12/2008 | Warner |
| 7,471,574 | B2 | 12/2008 | Park |
| 7,477,570 | B2 | 1/2009 | Warner |
| 2003/0196044 | A1 | 10/2003 | Ramirez et al. |
| 2005/0149708 | A1 | 7/2005 | Gat et al. |
| 2006/0101207 | A1* | 5/2006 | Nakazato ............. 711/131 |
| 2006/0101217 | A1 | 5/2006 | Maki |
| 2006/0174090 | A1 | 8/2006 | Sartorius et al. |
| 2009/0122629 | A1 | 5/2009 | Warner |

FOREIGN PATENT DOCUMENTS

| | | |
|---|---|---|
| EP | A-1 531 480 | 8/2006 |
| WO | WO 98/06100 A | 2/1998 |

OTHER PUBLICATIONS

IEEE P802.11g/D8.2, Apr. 2003 (Supplement to ANSI/IEEE Std 802.11-1999(Reaff 2003)); Draft Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE 802.11n; IEEE 802.11-04/0889r6; IEEE P802.11 Wireless LANs; TGn Sync Proposal Technical Specification; May 2005; 131 pages.

IEEE Std 802.11a—1999 (Supplement to IEEE Std 802.11—1999); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: High-speed Physical Layer in the 5 GHz Band; LAN/MAN Standards Committee of the IEEE Computer Society; Sep. 16, 1999; 91 pages.

IEEE Std 802.11b—1999 (Supplement to IEEE Std 802.11—1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.16—2004 (Revision of IEEE Std 802.16—2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

IEEE Std 802.11h™—2003 [Amendment to IEEE Std 802.11™, 1999 Edition (Reaff 2003) as amended by IEEE Stds 802.11a™—1999, 802.11b™—1999, 802.11b™—1999/Cor 1—2001, 802.11d™—2001, 802.11g ™—2003]; IEEE Standard for Information technology—Telecommunications and information exchange between systems—Local and metropolitan area networks—Specific requirements; Part 11: Wireless LAN Medium Access Control (MAC) and Physical Layer (PHY) specifications; Amendment 5: Spectrum and Transmit Power Management Extensions in the 5 GHz band in Europe; IEEE Computer Society; LAN/MAN Standards Committee; Oct. 14, 2003; 75 pages.

IEEE 802.20-PD-06; IEEE P 802.20™ V14; Jul. 16, 2004; Draft 802.20 Permanent Document; System Requirements for IEEE 802.20 Mobile Broadband Wireless Access Systems—Version 14; 24 pages.

Specification of the Bluetooth System—Specification vol. 0; Master Table of Contents & Compliance Requirements; Covered Core Package version: 2.0 +EDR; Current Master TOC issued: Nov. 4, 2004; Part A, pp. 1-74; vol. 1, pp. 1-92; vol. 2 & 3, pp. 1-814; vol. 4, pp. 1-250.

Notification of Transmittal of the International Search Report and the Written Opinion of The International Searching Authority, or the Declaration dated Jul. 22, 2008 in reference to PCT/US2008/004439.

Notification of Transmittal of the International Preliminary Report on Patentability Including Written Opinion of The International Searching Authority regarding PCT/US2007/021796 dated Feb. 27, 2008.

\* cited by examiner

PROCESSOR INSTRUCTION CACHE WITH DUAL-READ MODES

CROSS-REFERENCE TO RELATED APPLICATIONS

This application is a continuation of U.S. Non-Provisional application Ser. No. 11/870,833, now U.S. Pat. No. 7,787,324, filed Oct. 11, 2007, which claims the benefit of U.S. Provisional Application No. 60/829,438, filed on Oct. 13, 2006. The disclosure of the above application is incorporated herein by reference in its entirety.

FIELD

The present disclosure relates to semiconductor integrated circuits and processors, and more particularly to processor structures and memory cell access techniques.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Memory in a cellular phone or a computer system may be arranged in a memory hierarchy, which includes memory devices of different speeds, types and sizes. The type, size and proximity of a memory device to a processor affect speed of that memory device. Due to costs of memory and limited space near the processor, a memory hierarchy may be organized into several levels.

Many processors use and/or have memory caches to store copies of highly used data and instructions in order to improve access speed and overall processing speed. A memory cache, such as an instruction (I)-cache, is a portion of memory that may include high-speed static random access memory (SRAM). SRAM is included instead of slower dynamic RAM (DRAM), which is commonly used for a main memory. The memory cache may be referred to as a cache store or RAM (Random Access Memory) cache. Memory caches may be included at the highest level of memory and on the same integrated circuit (IC) as the processor. Such internal memory caches are also referred to as local or Level 1 (L1) caches.

A memory cache includes an array of cells. Each cell stores a bit of information. An instruction, which may include, for example, 4-8 bits is stored and accessed through a read cycle. To access a word of instructions multiple read cycles are executed. During each read cycle, cells associated with an instruction are accessed by toggling both a row path (word line) and multiple column paths (bit lines) of the array for that word. The toggling of row and column paths includes tasks such as decoding row and column addresses, generating a word line signal, precharging bit lines, sensing-amplification, and latching data. Sensing-amplification refers to the detection and amplification of stored bit information. A significant amount of energy is associated with the stated tasks.

SUMMARY

In one embodiment, a processor is provided that includes a cache memory. The cache memory includes an array of cells, word lines and bit lines. A control module enables a word line of the word lines to access a first cell in the enabled word line. The control module disables the word line and maintains the word line in a disabled state to access a second cell in the word line.

In other features, the control module accesses multiple cells in the array through separate cycled selection of the bit lines. The control module generates a single word line pulse associated with one of the word lines. In other features, the control module operates in a discrete read mode and a sequential read mode.

In yet other features, the control module generates a sequential read signal to enable a sequential read mode and generates a word line signal based on the sequential read signal.

In still other features, the control module generates a sequential read signal to enable a sequential read mode and precharges the bit lines based on the sequential read signal.

In other features, the control module, when in a discrete mode, performs row address decoding for each cycle associated with access of each of the cells.

In further features, the control module, when in a sequential mode, performs address decoding for a single row and enables a word line for column cell sets. The control module selects, senses and amplifies a column cell set of the column cell sets for column address decoding. The control module disables the word line for column address decoding and access of column cell sets of the column cell sets other than the column cell set.

In other features, the control module operates in a first mode and in a second mode. The control module, when in the first mode, pre-charges the bit lines and performs row address decoding for each read cycle. The control module, when in the second mode, precharges the bit lines and performs row address decoding for a first read cycle and does not precharge the bit lines and does not perform row address decoding for a second read cycle. The control module, when in the second mode, enables an address counter that is associated with pointing a column address to a next location after each column access. The address counter, when the column address is associated with an end of a word, is reset and memory access is permitted for a next discrete or sequential read access.

In other features, the control module precharges the bit lines when accessing a first set of cells of the array and does not precharge the bit lines when accessing a second set of cells of the array.

In yet other features, the cache memory includes at least one of an instruction cache and a static random access memory (SRAM).

In other features, a column decoder is further included and selects the second cell via a column select signal. The control module generates a latch signal to latch bit information in the second cell based on the column select signal. In other features, latches are included and latch bit information in the first and second cells. In other features, a sensing-amplification module is included and detects and amplifies bit information in the first and second cells.

In still other features, a row decoder is included. The control module generates a word line signal via the row decoder to access a first set of cells.

In other features, the word line signal includes an extended period to increase bit line signal separation and to compensate for leakage. In other features, the extended period increases bit line separation time and sets bit line separation at a predetermined voltage. In other features, the extended period is based on a predetermined number of read cycles.

In other features, a column decoder is included. The control module generates bit line signals via the column decoder to access a first set of cells.

In further features, the control module precharges bit lines after a word line extended period. In other features, the control module precharges the bit lines once for multiple cell access cycles.

In other features, a sense-amplifier is included that has common lines and that receives a precharge signal to precharge the common lines before latching bit information between accesses to sets of cells.

In other features, an integrated circuit is provided that includes the processor. In other features, the integrated circuit further includes an external memory that is in communication with the processor.

In still other features, a cellular phone is provided that includes the processor. In other features, the cellular phone further includes an external memory that is in communication with the processor.

In yet other features, a communication system is provided that includes the processor. In other features, the communication system further includes an external memory that is in communication with the processor.

In other features, a method is provided and includes providing a cache memory with an array of cells, word lines, and bit lines. A word line of the word lines is enabled to access a first cell in the word line. The word line is disabled. The word line is maintained in a disabled state to access a second cell in the word line.

In other features, the method further includes accessing multiple cells in the array through separate cycled selection of the bit lines. A single word line pulse associated with one of the word lines is generated. In other features, the method includes operating in a discrete read mode and a sequential read mode.

In other features, the method further includes generating a sequential read signal to enable a sequential read mode. A word line signal is generated based on the sequential read signal.

In further features, the method further includes generating a sequential read signal to enable a sequential read mode. The bit lines are precharged based on the sequential read signal.

In still other features, the method further includes performing row address decoding for each cycle associated with access of each of the cells when in a discrete mode.

In yet other features, the method further includes, when in a sequential mode, performing address decoding for a single row and enabling a word line for column cell sets. A column cell set of the column cell sets is selected, sensed and amplified for column address decoding. The word line is disabled for column address decoding and accessing of column cell sets of the column cell sets other than the column cell set.

In other features, the method further includes pre-charging the bit lines and performing row address decoding for each read cycle when in a first mode. When in the second mode, the method further includes precharging the bit lines and performing row address decoding for a first read cycle and refraining from precharging the bit lines and refraining from performing row address decoding for a second read cycle. When in the second mode, an address counter is enabled that is associated with pointing a column address to a next location after each column access. When the column address is associated with an end of a word, the address counter is reset and permitted access to memory for a next discrete or sequential read access.

In other features, the method further includes precharging the bit lines when accessing a first set of cells of the array. The method further includes refraining from precharging the bit lines when accessing a second set of cells of the array.

In other features, the method further includes selecting the second cell via a column select signal and generating a latch signal to latch bit information in the second cell based on the column select signal. In other features, the method further includes latching bit information in the first and second cells. In other features, the method further includes detecting and amplifying bit information in the first and second cells. In other features, the method further includes generating a word line signal via a row decoder to access a first set of cells.

In further features, the word line signal includes an extended period to increase bit line signal separation and to compensate for leakage. In other features, the extended period increases bit line separation time and sets bit line separation at a predetermined voltage. In other features, the extended period is based on a predetermined number of read cycles. In other features, the method further includes generating bit line signals via a column decoder to access a first set of cells.

In still other features, the method further includes precharging bit lines after a word line extended period. In other features, the method further includes precharging the bit lines once for multiple cell access cycles.

In yet other features, the method further includes receiving a precharge signal via a sense-amplifier to precharge common lines before latching bit information between accesses to sets of cells.

In other features, a processor is provided and includes a cache memory with an array of cells, word lines, and bit lines. Control means for enabling a word line of the word lines to access a first cell in the word line is included. The control means disables the word line and maintains the word line in a disabled state to access a second cell in the word line.

In other features, the control means accesses multiple cells in the array through separate cycled selection of the bit lines and generates a single word line pulse associated with one of the word lines. In other features, the control means operates in a discrete read mode and a sequential read mode.

In other features, the control means generates a sequential read signal to enable a sequential read mode and generates a word line signal based on the sequential read signal.

In other features, the control means generates a sequential read signal to enable a sequential read mode and precharges the bit lines based on the sequential read signal.

In other features, the control means, when in a discrete mode, performs row address decoding for each cycle associated with access of each of the cells.

In still other features, the control means, when in a sequential mode, performs address decoding for a single row and enables a word line for column cell sets. The control means selects, senses and amplifies a column cell set of the column cell sets for column address decoding. The control means disables the word line for column address decoding and access of column cell sets of the column cell sets other than the column cell set.

In yet other features, the control means operates in a first mode and a second mode. The control means, when in the first mode, pre-charges the bit lines and performs row address decoding for each read cycle. The control means, when in the second mode, precharges the bit lines and performs row address decoding for a first read cycle and does not precharge the bit lines and does not perform row address decoding for a second read cycle. The control means, when in the second mode, enables an address counter that is associated with pointing a column address to a next location after each column access. The address counter, when the column address is associated with an end of a word, is reset and memory access is permitted for a next discrete or sequential read access.

In further features, the control means precharges the bit lines when accessing a first set of cells of the array and that does not precharge the bit lines when accessing a second set of cells of the array.

In other features, the cache memory includes at least one of an instruction cache and a static random access memory (SRAM).

In other features, column decoding means for selecting the second cell via a column select signal is further included. The control means generates a latch signal to latch bit information in the second cell based on the column select signal. In other features, latching means for latching bit information in the first and second cells is further included. In other features, sensing-amplification means for detecting and amplifying bit information in the first and second cells is further included. In other features, the control means generates a word line signal via a row decoder to access a first set of cells.

In yet other features, the word line signal includes an extended period to increase bit line signal separation and to compensate for leakage. In other features, the extended period increases bit line separation time and sets bit line separation at a predetermined voltage. In other features, the extended period is based on a predetermined number of read cycles. In other features, the control means generates bit line signals via a column decoder to access a first set of cells.

In still other features, the control means precharges multiple bit lines after a word line extended period. In other features, the control means precharges the bit lines once for multiple cell access cycles.

In other features, sense-amplifier means for receiving a precharge signal to precharge common lines of the sense-amplifier means prior to latching bit information between accesses to sets of cells is further included.

In other features, an integrated circuit is provided that includes the processor. In other features, the integrated circuit further includes an external memory that is in communication with the processor.

In other features, a cellular phone is provided and includes the processor. In other features, the cellular phone further includes an external memory that is in communication with the processor.

In other features, a communication system is provided that includes the processor. In other features, the communication system further includes an external memory that is in communication with the processor.

In further features, a processor is provided and includes a cache memory with an array of cells, word lines, and bit lines. A control module accesses cells associated with instructions stored in the cache memory during access cycles. The control module precharges the bit lines when accessing a first set of cells of the array and does not precharge the bit lines when accessing a second set of cells of the array.

In still other features, the control module enables a word line of the cache memory to access a first cell in the word line. The control module disables the word line and maintains the word line in a disabled state when accessing a second cell in the word line.

In yet other features, the control module accesses multiple cells in the array through separate cycled selection of the bit lines and generates a single word line pulse associated with one of the word lines. In other features, the control module operates in a discrete read mode and a sequential read mode.

In other features, the control module generates a sequential read signal to enable a sequential read mode and generates a word line signal based on the sequential read signal.

In other features, the control module generates a sequential read signal to enable a sequential read mode and precharges the bit lines based on the sequential read signal.

In other features, the control module, when in a discrete mode, performs row address decoding for each cycle associated with access of each of the cells.

In other features, the control module, when in a sequential mode, performs row address decoding for the first cell and maintains the word line in a disabled state to access the second cell.

In still other features, the control module operates in a first mode and a second mode. The control module, when in the first mode, precharges the bit lines and performs row address decoding for each read cycle. The control module, when in the second mode, precharges the bit lines and performs row address decoding for a first read cycle and does not precharge the bit lines and does not perform row address decoding for a second read cycle.

In yet other features, the cache memory includes at least one of an instruction cache and a static random access memory (SRAM).

In further features, a column decoder that selects the second cell via a column select signal is further included. The control module generates a latch signal to latch bit information in the second cell based on the column select signal. In other features, latches are further included that latch bit information in the first and second cells. In other features, a sensing-amplification module is further included that detects and amplifies bit information in the first and second cells. In other features, a row decoder is further included. The control module generates a word line signal via the row decoder to access the first cell.

In other features, the word line signal includes an extended period to increase bit line signal separation. In other features, the extended period increases bit line separation time and sets bit line separation at a predetermined voltage. In other features, the extended period is based on a predetermined number of read cycles.

In other features, a column decoder is further included. The control module generates bit line signals via the column decoder to access the first cell.

In other features, the control module precharges bit lines after a word line extended period. In other features, the control module precharges the bit lines once for multiple cell access cycles.

In still other features, a sense-amplifier is further included that has common lines and that receives a precharge signal to precharge the common lines before latching bit information in the first and second set of cells.

In other features, an integrated circuit is provided and includes the processor. In other features, the integrated circuit further includes an external memory in communication with the processor.

In yet other features, a communication device is provided and includes the processor. In other features, the communication device further includes an external memory in communication with the processor.

In further features, a method is provided and includes providing a cache memory with an array of cells, word lines, and bit lines. The method includes accessing cells associated with instructions stored in the cache memory during access cycles. The bit lines are precharged when accessing a first set of cells of the array. Precharging of the bit lines is not performed when accessing a second set of cells of the array.

In other features, the method further includes enabling a word line of the cache memory to access a first cell in the word line. The word line is disabled and is maintained in a disabled state when accessing a second cell in the word line.

In other features, the method further includes accessing multiple cells in the array through separate cycled selection of the bit lines. A single word line pulse associated with one of the word lines is generated. In other features, the method further includes operating in a discrete read mode and a sequential read mode.

In other features, the method further includes generating a sequential read signal to enable a sequential read mode. A word line signal based on the sequential read signal is generated.

In other features, the method further includes generating a sequential read signal to enable a sequential read mode. The bit lines are precharged based on the sequential read signal.

In further features, the method further includes performing row address decoding for each cycle associated with access of each of the cells when in a discrete mode.

In yet other features, the method further includes performing row address decoding for the first cell. The word line is maintained in a disabled state to access the second cell when in a sequential mode.

In still other features, the method further includes precharging the bit lines and performing row address decoding for each read cycle when in a first mode. When in a second mode, the bit lines are precharged and row address decoding is performed for a first read cycle and precharging of the bit lines and row address decoding is not performed for a second read cycle.

In other features, the method further includes selecting the second cell via a column select signal. A latch signal is generated to latch bit information in the second cell based on the column select signal. In other features, the method further includes latching bit information in the first and second cells. In other features, the method further includes detecting and amplifying bit information in the first and second cells. In other features, the method further includes generating a word line signal via a row decoder to access the first cell.

In other features, the word line signal includes an extended period to increase bit line signal separation. In other features, the extended period increases bit line separation time and sets bit line separation at a predetermined voltage. In other features, the extended period is based on a predetermined number of read cycles. In other features, the method further includes generating bit line signals via the column decoder to access the first cell.

In other features, the method further includes precharging bit lines after a word line extended period. In other features, the method further includes precharging the bit lines once for multiple cell access cycles.

In further features, the method further includes receiving a precharge signal to precharge common lines of a sense-amplifier prior to latching bit information in the first and second set of cells.

In other features, a processor is provided and includes a cache memory with an array of cells, word lines, and bit lines. The control means accesses cells associated with instructions stored in the cache memory during access cycles. The control means precharges the bit lines when accessing a first set of cells of the array and does not precharge the bit lines when accessing a second set of cells of the array.

In still other features, the control means enables a word line of the cache memory to access a first cell in the word line. The control means disables the word line and maintains the word line in a disabled state when accessing a second cell in the word line.

In yet other features, the control means accesses multiple cells in the array through separate cycled selection of the bit lines and generates a single word line pulse associated with one of the word lines. In other features, the control means operates in a discrete read mode and a sequential read mode.

In other features, the control means generates a sequential read signal to enable a sequential read mode and generates a word line signal based on the sequential read signal.

In other features, the control means generates a sequential read signal to enable a sequential read mode and precharges the bit lines based on the sequential read signal.

In other features, the control means, when in a discrete mode, performs row address decoding for each cycle associated with access of each of the cells.

In other features, the control means, when in a sequential mode, performs row address decoding for the first cell and maintains the word line in a disabled state to access the second cell.

In other features, the control means operates in a first mode and a second mode. The control means, when in the first mode, pre-charges the bit lines and performs row address decoding for each read cycle. The control means, when in the second mode, precharges the bit lines and performs row address decoding for a first read cycle and does not precharge the bit lines or perform row address decoding for a second read cycle.

In still other features, the cache memory includes at least one of an instruction cache and a static random access memory (SRAM).

In further features, column decoding means for selecting the second cell via a column select signal is included. The control means generates a latch signal to latch bit information in the second cell based on the column select signal. In other features, latching means for latching bit information in the first and second cells is included. In other features, sensing-amplification means for detecting and amplifying bit information in the first and second cells is included. In other features, the control means generates a word line signal via a row decoder to access the first cell.

In yet other features, the word line signal includes an extended period to increase bit line signal separation. In other features, the extended period increases bit line separation time and sets bit line separation at a predetermined voltage. In other features, the extended period is based on a predetermined number of read cycles. In other features, the control means generates bit line signals via a column decoder to access the first cell.

In other features, the control means precharges bit lines after a word line extended period. In other features, the control means precharges the bit lines once for multiple cell access cycles.

In other features, sense-amplifier means is included for receiving a precharge signal to precharge common lines of the sense-amplifier means prior to latching bit information in the first and second set of cells.

In other features, an integrated circuit is provided and includes the processor. In other features, the integrated circuit further includes an external memory in communication with the processor.

In other features, a communication device is provided and includes the processor. In other features, the communication device further includes an external memory in communication with the processor.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
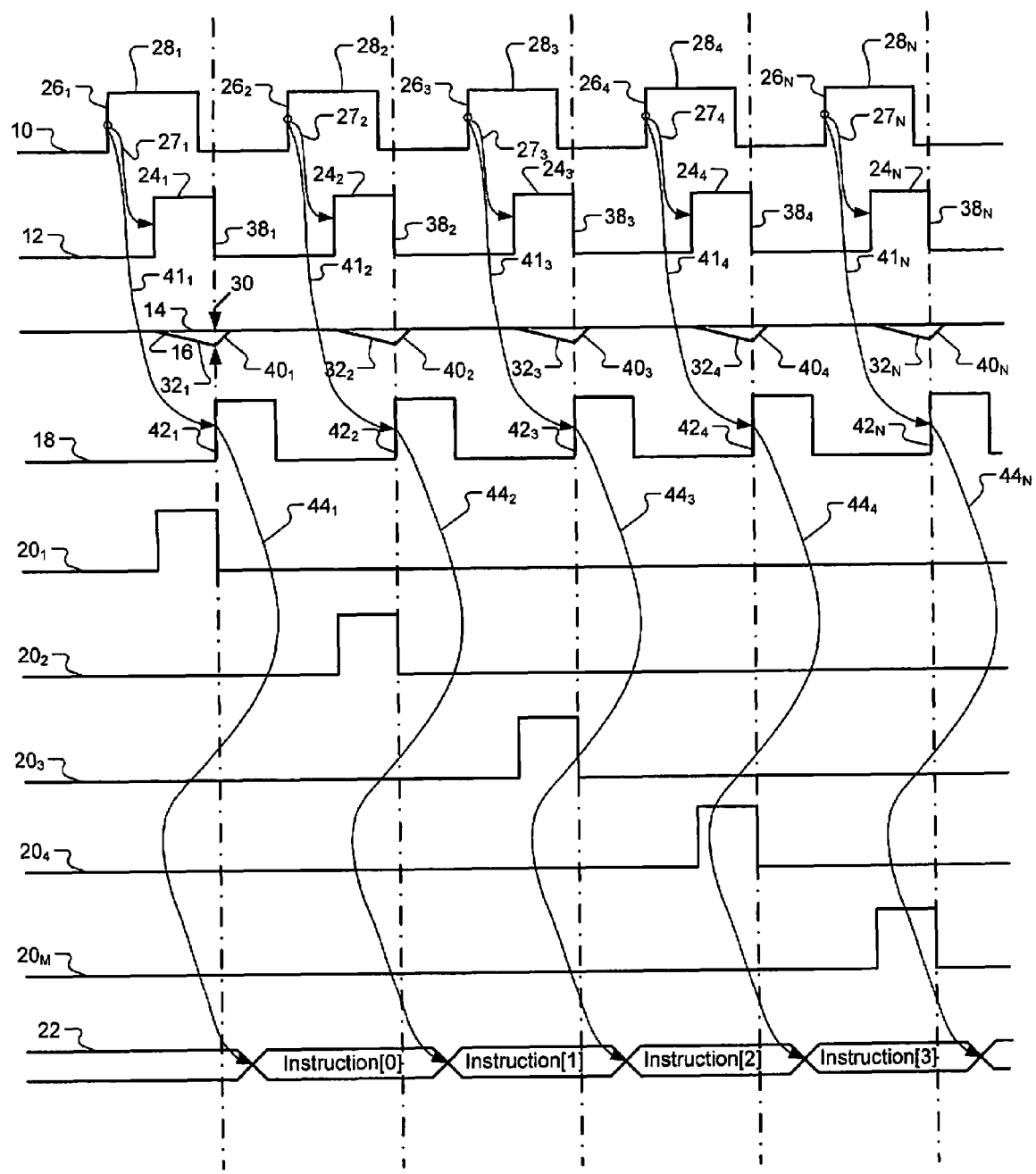
FIG. 1 is a signal timing diagram illustrating operation of a discrete read access system for a processor memory.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the terms processor and module may refer to an Application Specific Integrated Circuit (ASIC), an electronic circuit, a shared, dedicated, or group device and memory that execute one or more software or firmware programs, a combinational logic circuit, and/or other suitable components that provide the described functionality.

Also, in the following description the terms assert and assertion may refer to the generation of a pulse or the transitioning of a signal line from a deactive state to an active state. For example, a signal line may be transitioned from a LOW state to a HIGH state. The terms assert and assertion may also refer to the enabling of, by providing power to, one or more cells or cell lines for cell selection. The cell lines may include word lines and bit lines.

Traditionally, when reading a word of instructions from a cache memory of a processor, cells associated with each instruction (instruction cell set) of that word are individually accessed and latched. A word may include multiple instructions and be located along a single word line. Multiple read cycles are executed to access each instruction cell set on that word line. Each read cycle includes toggling of a row path and multiple column paths associated with a particular instruction. The toggling includes decoding row and column addresses, generating a word line signal, precharging bit lines associated with the word of interest, and sensing-amplification and latching of cell bits. Each word line may include, for example, four (4) to eight (8) instructions. This is illustrated and further described with the timing diagram of FIG. 1.

Referring now to FIG. 1, a signal timing diagram illustrating operation of a discrete read access system for a processor memory is shown. The timing diagram includes multiple signals that are based on a clock signal 10. The timing diagram includes a word line signal 12, first and second bit line signals (voltage levels of bit lines) 14, 16, a sense-amplification signal 18, column select signals 20 and an instruction output signal 22. During read access of a word of instructions on a processor memory, the word line signal 12 is asserted, as shown by word line pulses 24. A word line pulse 24 is generated for each cell access cycle, such as a read cycle. Each read cycle includes accessing and latching bit information in cells associated with a particular instruction. The word line signal pulses 24 are generated based on the rising edges 26 of the clock signal 10, as denoted by arrows 27. As shown, a word line signal pulse is generated for each clock pulse 28.

Activation of a word line causes bit line separation between voltage levels of bit lines. An example of bit line separation is shown and denoted by varying gap 30 between the bit line signals 14, 16. Bit line separation, which is equal to a difference in voltage between bit lines of a cell, increases with the amount of time that the word line is enabled. Increase in bit line separation is shown by declined ramp portion 32 of the second bit line signal 16 relative to the first bit line signal 14. Bit lines associated with the word of instructions are precharged prior to the generation of a first word line signal pulse and after each word line signal pulse during a deactivation state. Bit line separation is returned to a zero separation state when precharged and upon disabling of the word line signal 12, illustrated by falling edges 38 of the word line signal 12. A decrease in bit line separation is shown by inclined ramp portions 40 of the second bit line signal 16 relative to the first bit line signal 14.

The sense-amplification signal 18 is generated to initiate acquiring, amplifying, and latching of bit information stored in a cell array. The sense amplification signal 18 is generated based on the rising edges 26, as denoted by arrows 41. A column or columns of a cell array that are associated with an instruction are selected. The selection may occur simultaneously with the generation of a word line signal or signal pulse. Five column selection signals are shown, which represent the individual selection of column sets associated with five instructions. Various numbers of instructions may be acquired. The sense-amplification signal 18 is generated to detect bit line separation for the selected cells, which provides bit information.

The sense-amplification signal 18 is generated with the falling edges of the word line signal 12 and the column selection signals 20. The bit information for each cell in a set of cells is latched and provided as the instruction output signal 22 based on rising edges 42 of the sense-amplification signal 18, as denoted by arrows 44. Four instructions of the instruction output signal 22 are shown and denoted Instructions [0]-Instructions[3].

As a result of the above-described cell access technique for retrieving cell information for a word of instructions, many instructions on a word line are retrieved and discarded for each read cycle. The term discarded refers to the non-selection and non-latching of bits within asserted cells. Since all of the cells along a word line and/or all of the cells associated with a word of instructions are asserted for each read cycle and since only one instruction is latched per word line assertion, bits of other asserted non-selected cells in that word line are discarded. A significant amount of energy is wasted by re-toggling the same row path and by precharging bit lines to obtain additional instructions in the same word line. The embodiments disclosed below reduce the amount of power needed to retrieve and latch a word of instructions.

Figure 2:
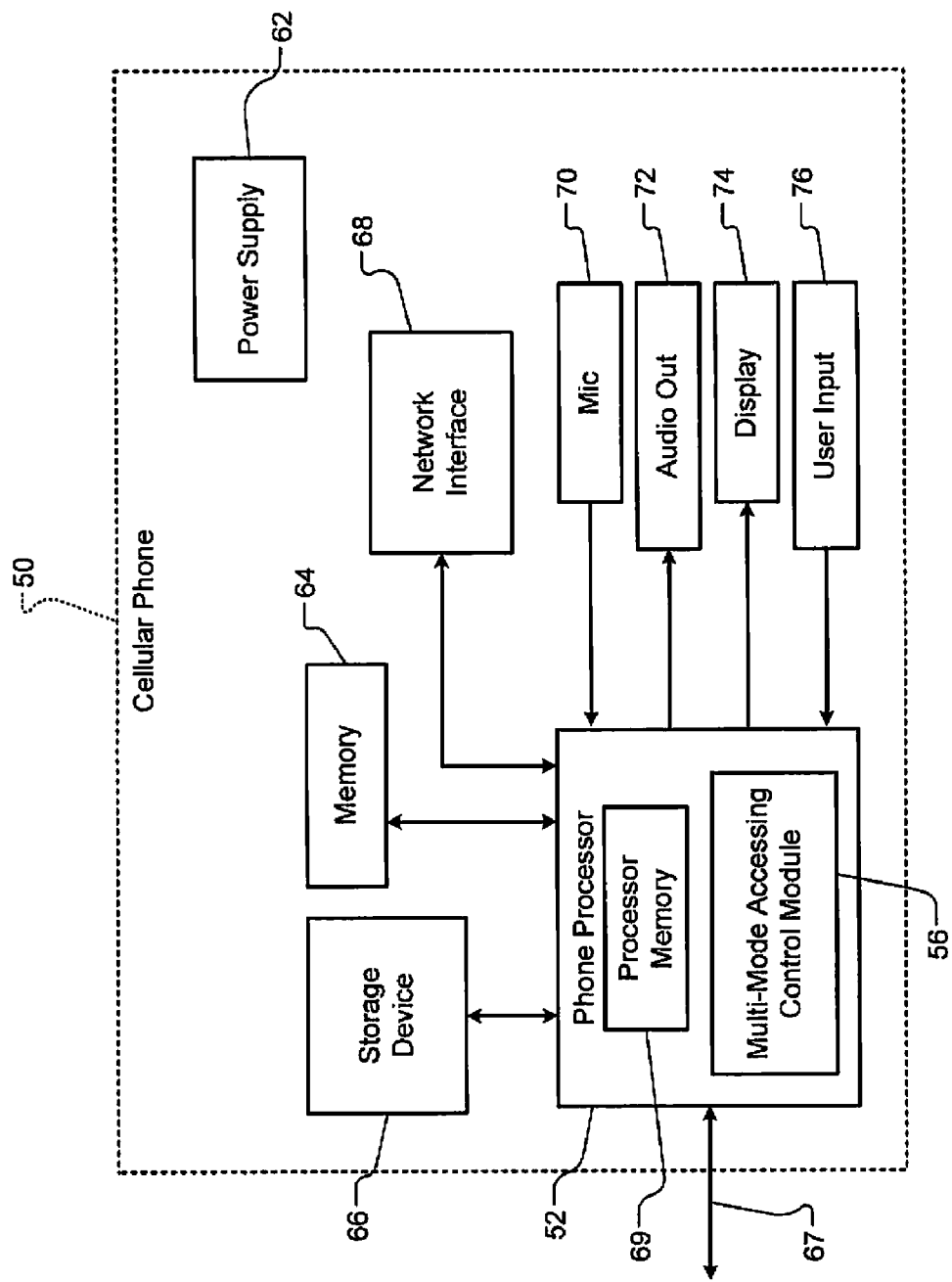
FIG. 2 is a functional block diagram of a cellular phone incorporating a phone processor with a multi-mode accessing control module in accordance with an embodiment of the present disclosure.

Referring to FIG. 2, a functional block diagram of a cellular phone 50 is shown. The cellular phone 50 may be considered a communication system and/or may be part of a communication system and includes a phone processor 52 that has a multi-mode accessing control module 56. The cellular phone 50 includes a power supply 62, a memory 64, a storage device 66, and a cellular network interface 67. The phone processor 52 may be part of or include an ASIC. The phone processor 52 also includes an onboard processor memory 69. The processor memory 69 may for example be an instruction (I)-cache, a static random access memory (SRAM), some other onboard processor memory, or a combination thereof. The control module 56 operates in multiple read modes in association with the processor memory 69. The cellular phone 50 may also include a network interface 68, a microphone 70, an audio output 72 such as a speaker and/or output jack, a display 74, and a user input device 76 such as a keypad and/or pointing device. If the network interface 68 includes a wireless local area network interface, an antenna (not shown) may be included.

The control module 56 operates in two or more modes, including a first mode or discrete memory access read mode and a second mode or sequential memory access read mode. During the discrete read mode, the control module accesses and latches bits stored in individual cells within the processor memory through respective word line and bit line assertion. In other words, for each read cycle bits associated with a single cell or a single instruction are latched. For each read cycle a word line signal pulse is generated.

During the sequential read mode, the control module 56 accesses and latches bits in multiple cells or in multiple instructions within the processor memory 69 along a word line for a single word line assertion. Put another way, for a single generated word line pulse, a word of instructions may be latched. During the sequential read mode, multiple instructions may be read regardless of order along a word line. Since a word line is asserted once for a word of instructions, a power savings is achieved over the discrete read mode.

The phone processor 52 may receive input signals from the cellular network interface 67, the network interface 68, the microphone 70, and/or the user input device 76. The phone processor 52 may process signals, including encoding, decoding, filtering, and/or formatting, and generate output signals. The output signals may be communicated to one or more of the memory 64, the storage device 66, the cellular network interface 67, the network interface 68, and the audio output 72.

The memory 64 may include random access memory (RAM) and/or nonvolatile memory such as flash memory, semiconductor memory, solid state memory, phase change memory, or multi-state memory, in which each memory cell has more than two states. The storage device 66 may include an optical storage drive, such as a DVD drive, and/or a hard disk drive (HDD). The power supply 62 provides power to the components of the cellular phone 50.

Figure 3:
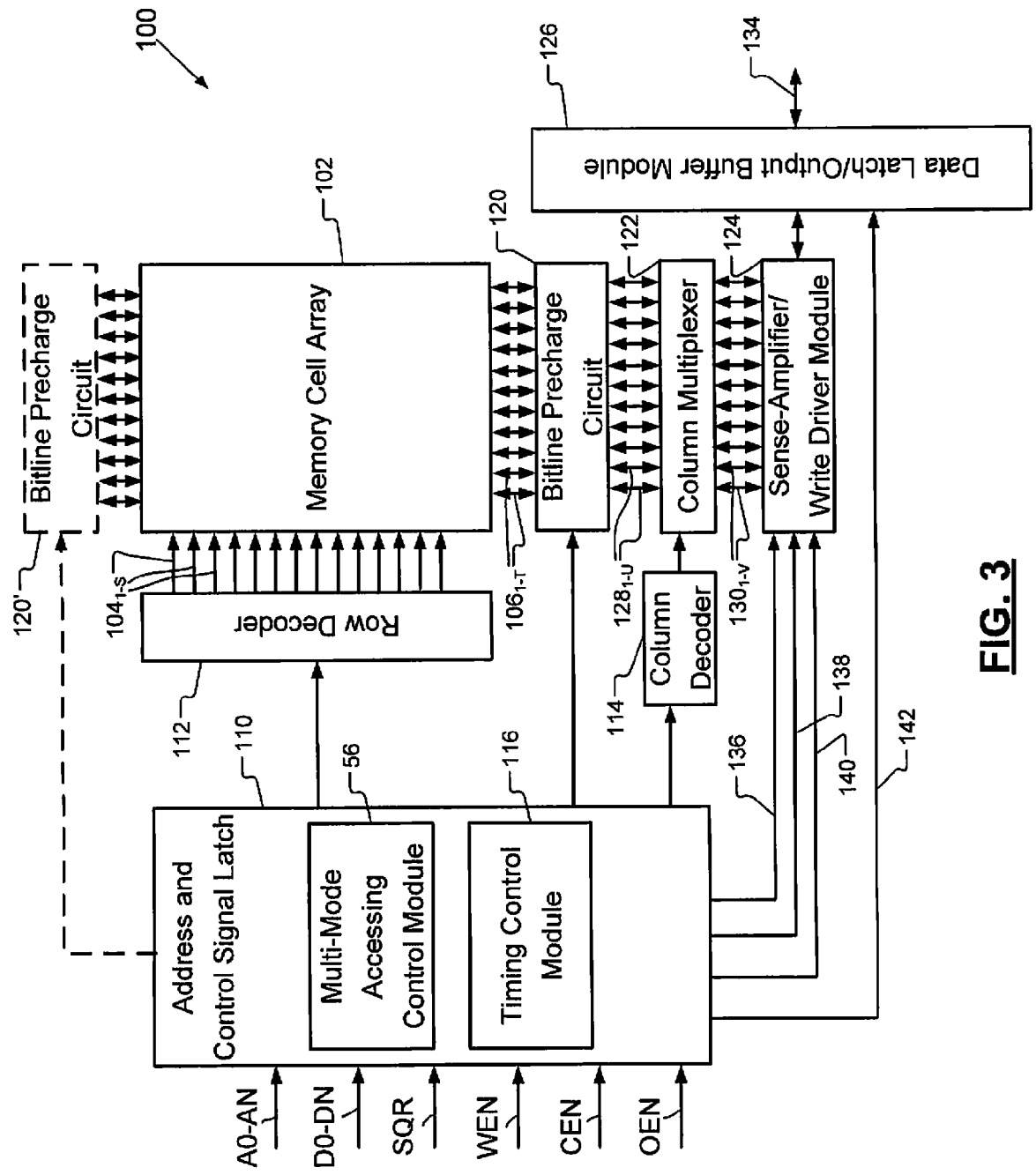
FIG. 3 is a functional block diagram of a multi-mode processor in accordance with an embodiment of the present disclosure.

Referring also to FIG. 3, a functional block diagram of a multi-mode processor 100 is shown. The processor 100 may be used as part of or in replacement of the phone processor 52 of the embodiment of FIG. 2. The processor 100 includes a memory cell array 102, which includes rows and columns of memory cells. The memory cells are accessed through row and column selection. A row is selected by asserting a word line and a column is selected by asserting or precharging a bit line or pair of bit lines. Word line signals are denoted as 104 and bit line signals are denoted as 106. An address and control signal latch 110 receives address information, which is used by a row decoder 112 and a column decoder 114 to select the rows and columns of the memory cell array 102. The address and control signal latch 110, as well as other elements of the processor 100, such as the row decoder 112 and the column decoder 114, may be considered part of the multi-mode control module 56.

The address and control signal latch 110 may include the multi-mode accessing control module 56 and/or a timing control module 116. The address and control signal latch 110 may be in communication with a bus and receive a signal that has data DO-DN that is stored on the memory cell array 102 during a write mode. The address and control signal latch 110 may also receive a signal-to-quantization ratio (SQR) signal, a write enable signal (WEN), a chip enable signal (CEN), and an output enable signal (OEN) for respective improvement in SQR, enablement of the write mode, operation of the memory cell array, and generation of an output signal.

The processor 100 further includes a bit line precharge circuit 120, a column multiplexer 122, a sense-amplifier/write driver module 124, and a data latch/output buffer module 126. The bit line precharge circuit 120 is used to precharge the bit lines of the memory cell array 102. The bit line precharge circuit 120 may include drivers, buffers, transistors and/or other bit line asserting elements. The bit line precharge circuit 120 may be coupled between the memory cell array 102 and the column multiplexer 122 or may be located on an opposite side of the memory cell array 102 as the column multiplexer 122, as shown by dashed bit line precharge circuit 120'.

During a read mode, the column multiplexer 122 is used to select the columns of the memory cell array 102 for latch purposes via column selection signals 128. After precharging of the bit lines, the column decoder 114, via the column multiplexer 122, selects certain columns. Stored bits, associated with the selected columns, are provided to one or more sense amplifiers of the sense-amplifier/write driver module 124 for amplification prior to reception by the data latch/output buffer module 126. The stored bits are received as bit information signals 130. The sense-amplifier/write driver module 124 receives a read/write mode signal 136, a sense-amplifier (SA) precharge signal 138, and a SA enable signal 140. The read/write mode signal 136 is a command signal for read or write operation. The SA precharge signal 138 and the SA enable signal 140 are generated to initiate and activate SA cells of the sense-amplifier/write driver module 124. The amplified data is latched and provided in the form of an output signal 134 by the data latch/output buffers module 126 based on a latch signal 142 from the address and control signal latch 110.

During the write mode, cells in the memory cell array 102 are similarly asserted via the row decoder 112 and the column decoder 114. The received data DO-DN is provided to the bit lines via write drivers in the sense-amplifier/write driver module 124.

Figure 4:
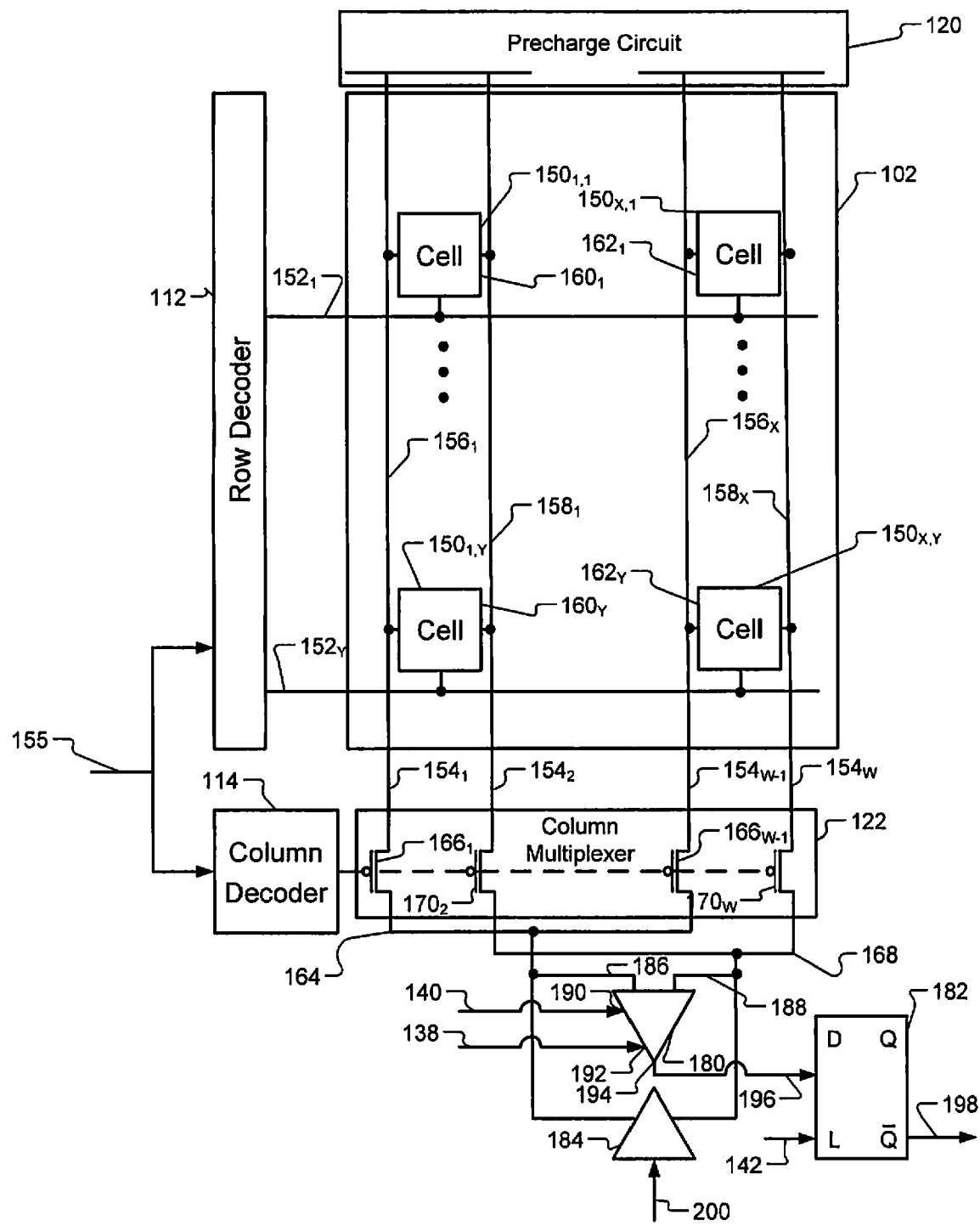
FIG. 4 is a block and schematic diagram of a portion of the processor of FIG. 3.

Referring also to FIG. 4, a block and schematic diagram of a portion of the processor 100 is shown. The memory cell array 102 includes cells 150, which each store a bit of information. The cells 150 are asserted via word lines 152 by the row decoder 112 and via bit lines 154 by the column decoder 114 and the bit line precharge circuit 120. Row decoding and column decoding is based on an address input signal 155. Each of the cells 150 has an associate first bit line and a second bit line, such as first bit lines 156 and second bit lines 158 for cells 160, 162, respectively. The first bit lines 156 are coupled together by a first common line 164 through respective transistors 166 of the column multiplexer 122. The second bit lines 158 are coupled together at a second common line 168 through respective transistors 170 of the column multiplexer 122. The column decoder 114 selects the cells 150 via the column multiplexer 122. The column multiplexer 122 may include transistors, as shown, or other bit line selection devices. The transistors may include p-channel metal-oxide-semiconductor field-effect (PMOS) transistors, as shown, or other transistors.

For the example embodiment shown, a sense-amplifier (SA) 180, a latch (shown as a D-flip flop) 182, and a write driver 184 are included. The SA 180 is coupled to the column multiplexer 122. The SA 180 and the write driver 184 are part of the sense-amplifier/write driver module 124. The SA 180 includes first and second inputs lines 186, 188, a SA enable input 190, a SA precharge input 192 and a SA output 194. The first input line 186 is coupled to the first common line 164 and the second input line 188 is coupled to the second common line 168. The first common line 164 and the second common line 168 have SA bit A and SA bit B signals, respectively. The SA enable input 190 and the SA precharge input 192 receive the SA enable signal 140 and the SA precharge signal 138, which may be generated by the control module 56 and/or the address and control signal latch 110.

Information on selected bit lines is provided via the column multiplexer 122 and detected and amplified by the SA 180. An SA output signal 196 from the SA output 194 is provided to the latch 182 at terminal D. Data at terminal D is latched and provided to data output terminal $\overline{Q}$ of the latch 182 and outputted as a data output signal 198. The data is latched based on the received latch signal 142. The received latch signal 142 may be generated by the control module 56 and/or the address and control signal latch 110. The SA 180 receives the SA precharge signal 138 and asserts the SA input lines 186, 188 (best seen in FIG. 5).

The latch 182 and the write driver 184 are respectively used for output and writing purposes. The latch 182 may be a D-flip flop as shown or some other latching device. The latch 182 acquires data on the SA output 194 and may be part of the data latch/output buffer module 126. The write driver 184 receives a data input signal 200 and provides data, which may be amplified, on the common lines 164, 168. From the common lines 164, 168 the data may be provided to the appropriate column of bit lines.

Figure 5:
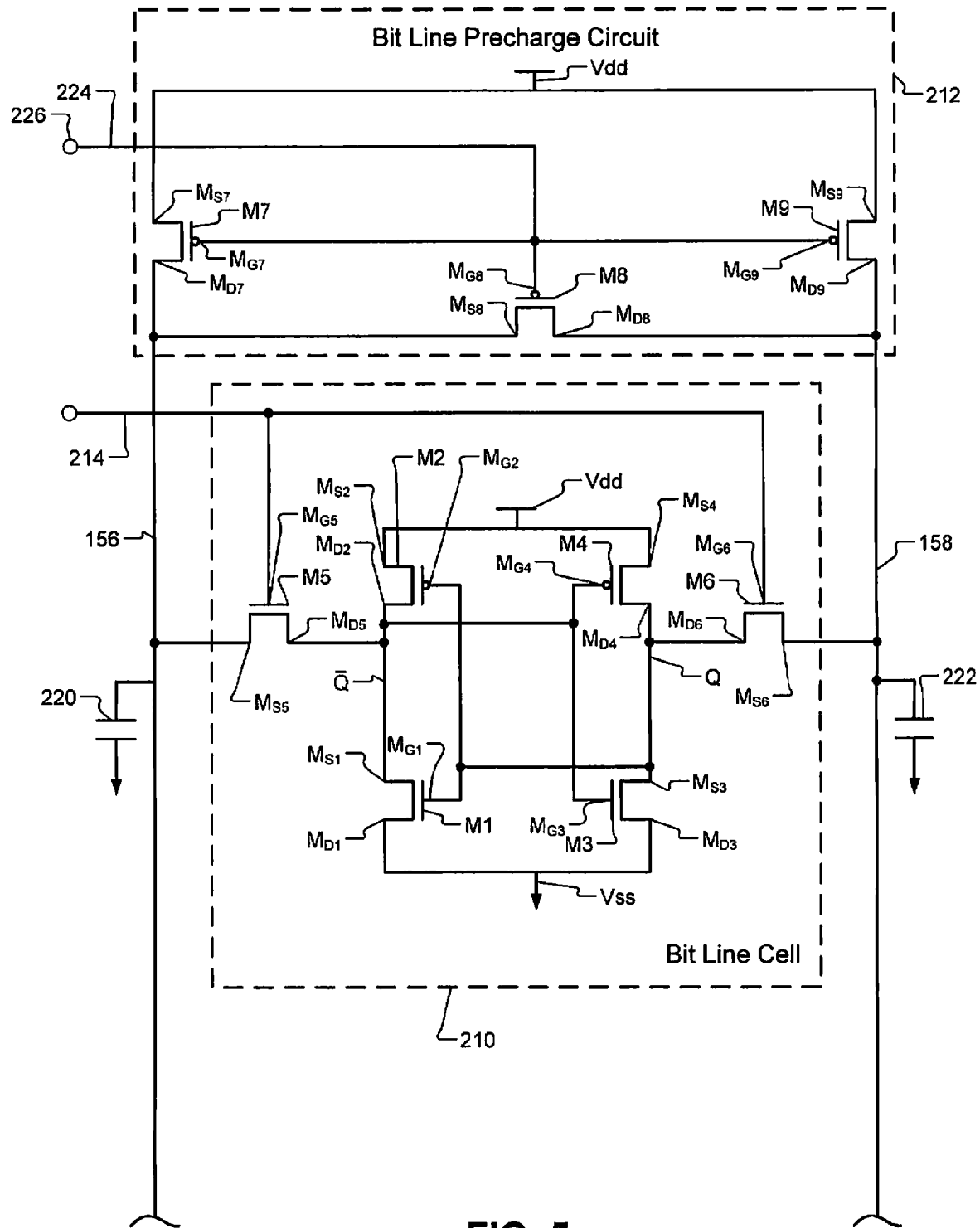
FIG. 5 is an exemplary storage cell and corresponding bit line precharge circuit in accordance with an embodiment of the present disclosure.

Referring to FIG. 5, an exemplary storage cell 210 and a corresponding bit line precharge circuit 212 is shown. The cell 210 is provided to illustrate one example configuration of a cell, which may be incorporated in the memory cell array 102 described above. Other configurations may be used. The cell 210, as shown, includes four storage transistors M1-M4 and two access transistors M5, M6. The four storage transistors M1-M4 form two-cross-coupled inverters that store a bit of information. The access transistors M5, M6 control access to the four storage transistors M1-M4, during read and write operations. The four storage transistors M1-M4 serve as a storage cell. The precharge circuit 212 includes transistors M7, M8, M9. The transistors M1-M9 may be PMOS or n-channel MOSFET (NMOS) transistors, as shown, or other transistors. In the embodiment shown, the transistors M2, M4, and M7-M9 are PMOS transistors and the transistors M1, M3, M5, M6 are NMOS transistors. The transistors M1-M9 have respective source terminals $M_{S1}$-$M_{S9}$, drain terminals $M_{D1}$-$M_{D9}$, and gate terminals $M_{G1}$-$M_{G9}$.

The cell 210 has a word line 214 and may have the first and second bit lines 156, 158. The first and second transistors M1, M2 are coupled in series and in parallel to the third and fourth transistors M3, M4, which are also coupled in series. The source terminals $M_{S2}$, $M_{S4}$ are coupled to a positive power source terminal Vdd. The drain terminals $M_{D2}$, $M_{D4}$ are coupled to source terminals $M_{S1}$, $M_{S3}$. The gate terminals $M_{G1}$, $M_{G2}$ are coupled together and to source terminal $M_{S3}$. The gate terminals $M_{G3}$, $M_{G4}$ are coupled together and to the drain terminal $M_{D2}$. The drain terminals $M_{D1}$, $M_{D3}$ are coupled to a negative power source terminal Vss. The source terminal $M_{S5}$ is coupled to the drain terminal $M_{D2}$. The source terminal $M_{S6}$ is coupled to the drain terminal $M_{D4}$. The source terminal $M_{S5}$ and the drain terminal $M_{D7}$ are coupled together and to the first bit line 156. The source terminal $M_{S6}$ and the drain terminal $M_{D9}$ are coupled together and to the second bit line 158.

Capacitance devices 220, 222, are shown and represent respective capacitance of bit line storage circuits associated with the bit lines 156, 158. The capacitance devices 220, 222 may be discrete storage capacitors, as shown, or may represent capacitance measured at each of the bit lines 156, 158 relative to points of reference.

The bit line precharge circuit 212 receives a bit line precharge signal 224 via the bit line precharge input 226, which is provided to the gates $M_{G7}$-$M_{G9}$. The sources $M_{S7}$, $M_{S9}$ are coupled to the power source terminal Vdd. The drain $M_{D7}$ is coupled to the source $M_{S8}$ and the drain $M_{D9}$ is coupled to the drain $M_{D8}$.

Access to the cell 210 is enabled by assertion of the word line 214, which controls the access transistors M5, M6. In general, voltage potential of the second bit line 158 is an inverse of the voltage potential of the first bit line 156. The cell 210 has three modes of operation, standby, read and write. Bit values, such as a zero (o) and a one (1) that are stored at locations denoted Q and $\overline{Q}$. During standby mode the word line 214 is not asserted and the transistors M1-M4 reinforce each other.

During the read mode, a read cycle is started by precharging both of the bit lines 156, 158. The word line 214 is then asserted, thereby enabling the transistors M5, M6. The stored values Q and $\overline{Q}$ are transferred to the bit lines 156, 158 by maintaining charge on one of the bit lines and discharging the other bit line. The bit line for which charge is maintained is pulled to Vdd. The bit line that is discharged is pulled to ground.

During the write mode, a value to be written is applied to the bit lines 156, 158. The word line 214 is then asserted and the value to be stored is latched into the cell 210. Write drivers override the previous state of the cross-coupled inverters.

Figure 6:
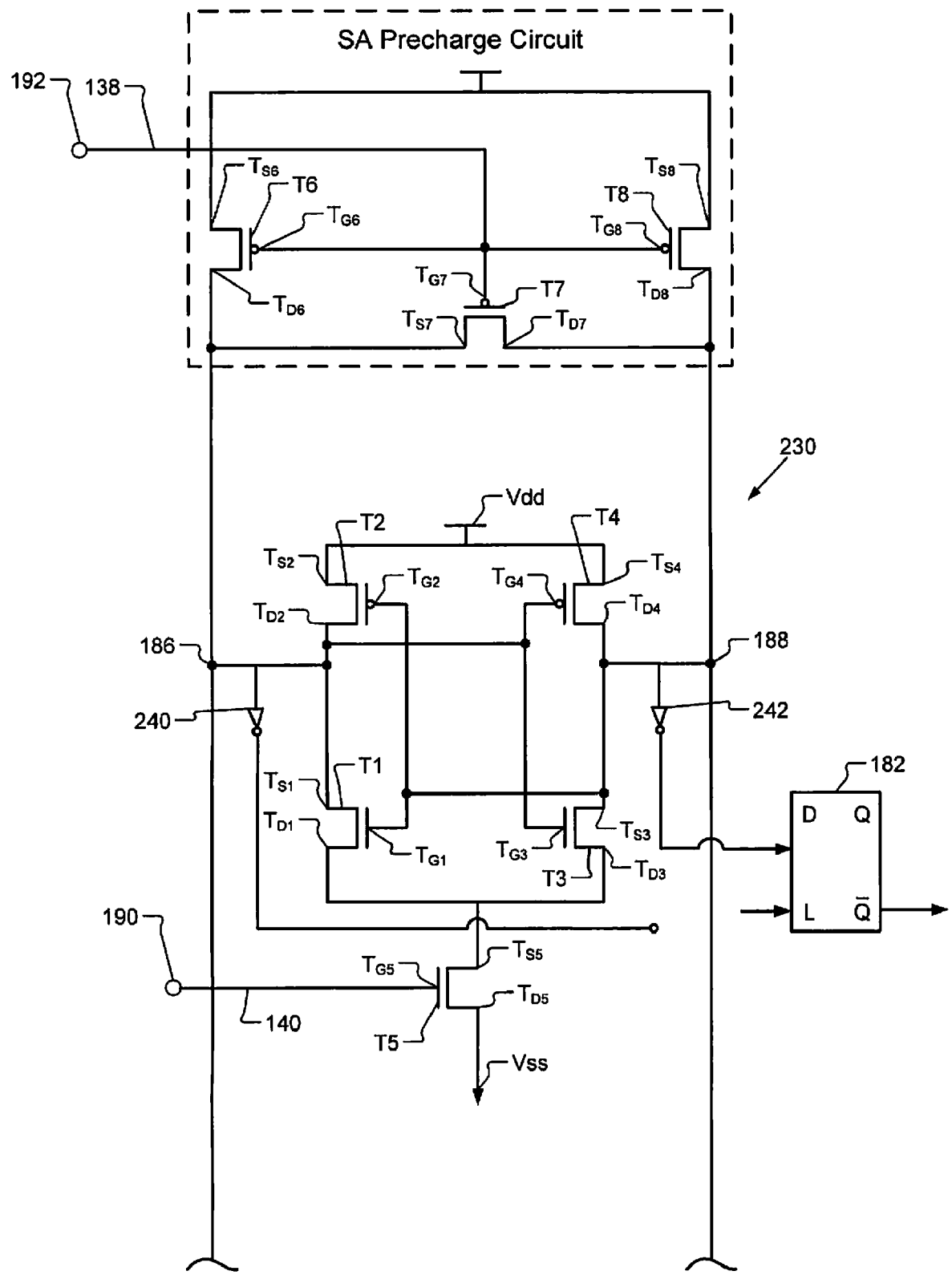
FIG. 6 is a schematic diagram of a sense-amplifier circuit and corresponding sense-amplifier precharge circuit in accordance with an embodiment of the present disclosure

Referring to FIG. 6, a schematic diagram of a SA circuit 230 including a SA precharge circuit 232 is shown. The SA circuit 230 and the SA precharge circuit 232 may be used as part of or in replacement of the SA 180. The SA circuit 230 includes five transistors T1-T4, which form an SA cell 234 and are cross-coupled, and a fifth transistor T5. The SA precharge circuit 232 includes three transistors T6-T8. The transistors T1-T8 may be PMOS or n-channel MOSFET (NMOS) transistors, as shown, or other transistors. In the embodiment shown, the transistors T2, T4, and T6-T8 are PMOS transistors and the transistors T1, T3, T5 are NMOS transistors. Each of the transistors T1-T8 has respective source terminals $T_{S1}$-$T_{S8}$, drain terminals $T_{D1}$-$T_{D8}$, and gate terminals $T_{G1}$-$T_{G8}$.

The first and second transistors T1, T2 are coupled in series and in parallel to the third and fourth transistors T3, T4, which are also coupled in series. The source terminals $T_{S2}$, $T_{S4}$ are coupled to a positive power source terminal Vdd. The drain terminals $T_{D2}$, $T_{D4}$ are coupled to the source terminals $T_{S1}$, $T_{S3}$. The gate terminals $T_{G1}$, $T_{G2}$ are coupled together and to the source terminal $T_{S3}$. The gate terminals $T_{G3}$, $T_{G4}$ are coupled together and to the drain terminal $T_{D2}$. The drain terminals $T_{D2}$, $T_{D4}$ may be respectively coupled to the common lines 186, 188, which may be referred to as SA common lines. The drain terminals $T_{D1}$, $T_{D3}$ are coupled to the source terminal $T_{S5}$. The gate terminal $T_{G5}$ may be coupled to the SA enable input 190. The drain terminal $T_{D5}$ is coupled to a negative power source terminal Vss. The drain terminals $T_{D2}$, $T_{D6}$ are coupled together. The drain terminals $T_{D4}$, $T_{D8}$ are coupled together.

The SA precharge circuit 232 receives the SA precharge signal 138 via the SA precharge input 192, which is provided to the gate terminals $T_{G6}$-$T_{G8}$. The source terminals $T_{S6}$, $T_{S8}$ are coupled to the power source terminal Vdd. The drain terminal $T_{D6}$ is coupled to the source terminal $T_{S7}$ and the drain terminal $T_{D8}$ is coupled to the drain terminal $T_{D7}$.

Inverters 240, 242 are coupled to the common lines 186, 188. One of the common lines 186, 188 is provided to the data input D of the latch 182. Although the second common line 188 is shown as being coupled to the data input D, the first common line 186 may be coupled to the data input D.

Figure 7:
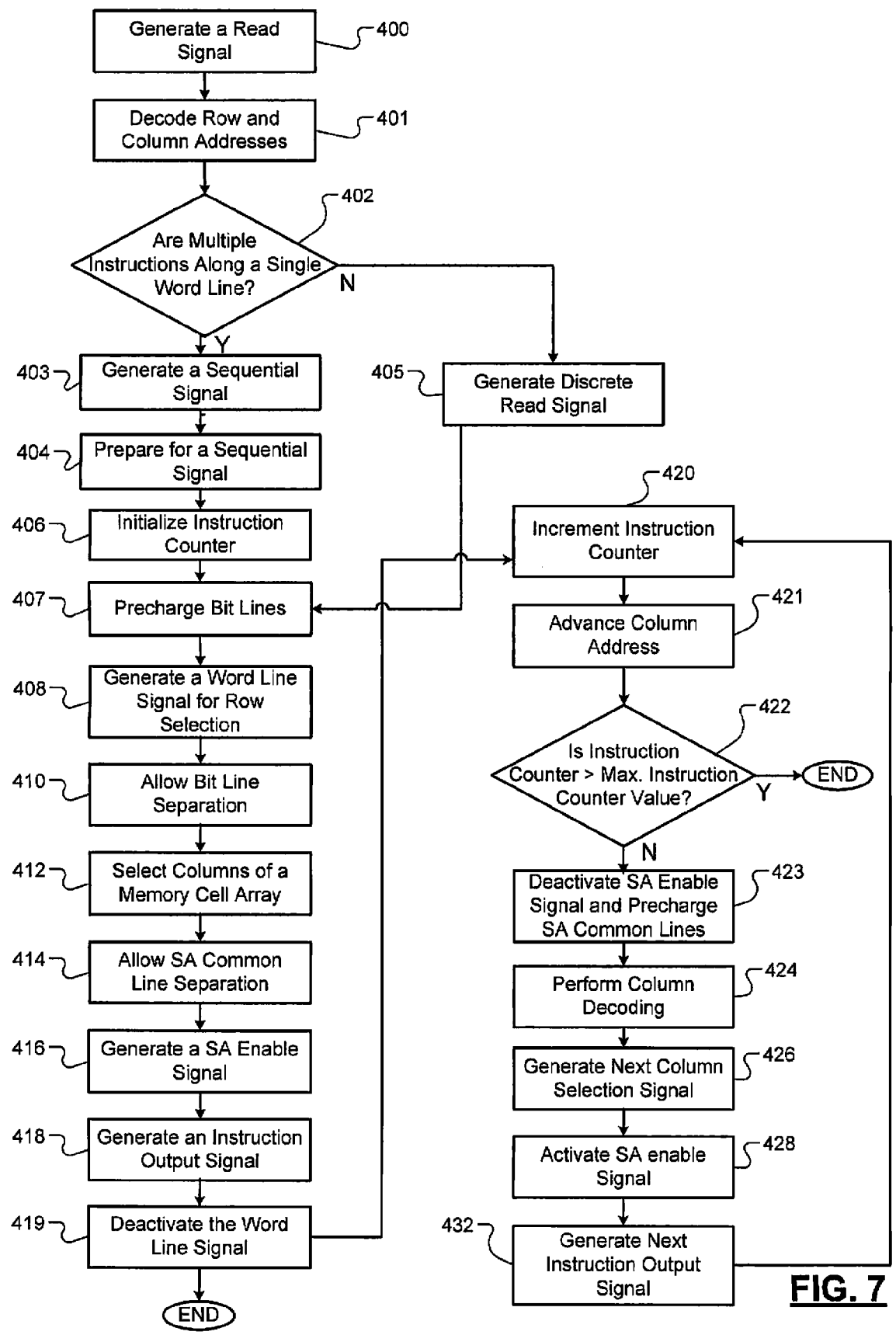
FIG. 7 is a flow diagram illustrating a method of operating a multi-mode processor in accordance with an embodiment of the present disclosure.
Figure 8:
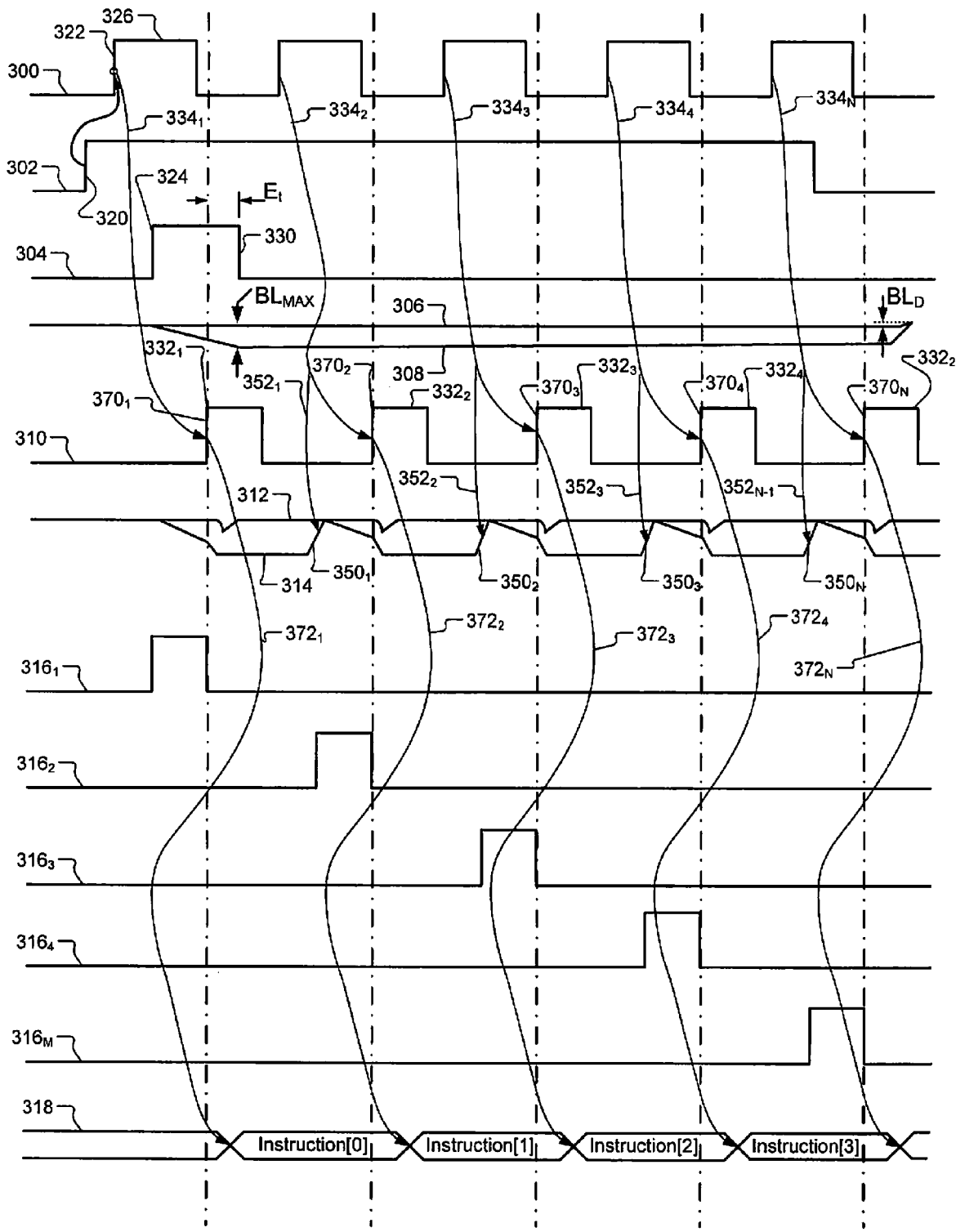
FIG. 8 is a signal timing diagram illustrating operation of the multi-mode processor during a sequential read mode of FIG. 7 in accordance with an embodiment of the present disclosure.

Referring to FIGS. 7 and 8, a flow diagram illustrating a method of operating a multi-mode processor and a signal timing diagram, illustrating operation of the multi-mode processor during a sequential read mode, are shown. The timing diagram includes multiple signals that are based on a clock signal 300 and a sequential read signal 302. The sequential read signal 302 is indicative of a sequential read mode. For the example shown, when the sequential read signal 302 is HIGH, an associated multi-mode processor is operated in a sequential read mode; otherwise the processor is operated in a discrete read mode. The timing diagram includes a word line signal 304, bit line signals (voltage levels) 306, 308, a SA enable signal 310, a SA bit A signal 312, a SA bit B signal 314, column select signals 316 and an instruction output signals 318. Although several of the steps of the method of FIG. 7 are described below with respect to the timing diagram and embodiment of FIG. 8, the method may be modified to apply to other timing diagrams and/or embodiments of the present disclosure.

In step 400, a read signal is generated to read a word of instructions from a processor memory, such as the processor memory 69. In step 401, received addresses for the word of instructions are row and column decoded, such as by the row and column decoders 112, 114.

In step 402, the processor determines whether two or more instructions, which are to be read, are located along a single word line. When two or more instructions are located along a single word line, the processor or associated control module, such as the multi-mode accessing control module 56, proceeds to step 404. When the processor is reading a single instruction along a word line, the processor proceeds to step 440.

In step 403, the processor or control module generates the sequential read signal 302, illustrated by rising edge 320.

In step 404, the processor prepares for a sequential read. Between the rising edge 320 and a rising edge 322 of the clock signal 300, the processor may perform tasks to prepare for the sequential read. The tasks may include setting parameters for generation of a single extended word line signal, the generation of SA precharge signals for read cycles, precharging of bit lines, precharging of common lines, or other tasks. One or more of the preparation tasks stated may not be performed.

In step 405, the processor or control module generates a discrete read signal.

In step 406, an instruction counter is initialized. After performance of step 405 or 406, step 407 is performed.

In step 407, bit lines for cells along a word line and associated with the word of instructions are precharged.

In step 408, the processor generates the word line signal 304, illustrated by rising edge 324 of the word line signal 304, in the middle of a clock pulse 326 based on the row decoded addresses. The word line signal 304 is in the form of a pulse, which is generated for a first instruction, Instruction [0]. The word line signal 304 is not generated for subsequent instructions, which are accessed along the same or a single word line. The word line signal 304 remains in an active or HIGH state until after detection of a falling edge 328 of the clock signal 300 and until approximately the middle of a subsequent LOW clock signal state. This provides an extended active word cycle, which increases bit line separation. An extended period of the word line signal 304 is denoted as $E_t$.

In order to accurately read bits from a cell array, a minimum bit line separation is provided. The minimum separation may be approximately equal to or greater than 100 mV. In one embodiment, the extended active word cycle is set to allow for a bit line separation of approximately equal to the minimum separation plus at least 30 mV, as denoted by maximum bit line separation $BL_{max}$. In another embodiment, the extended word cycle is set to allow for bit line separation of approximately 150 mV. The extended word cycle is directly related to number of read cycles for a given word of instructions or number of instructions read for the generated word line signal 304. The additional separation aids in assuring that an accurate read occurs for each read cycle.

In step 410, with the generation of the word line signal 304, bit line separation begins and thus, voltage potential across bit line pairs increases. The maximum bit line separation $BL_{max}$ occurs approximately with a falling edge 330 of the word line signal 304. The generation of the word line signal causes bit line separation between voltage levels of bit lines.

In step 412, a column selection signal, such as one of the column selection signals 316, is generated to select one or more columns or pair of bit lines associated with an instruction. The column selection signal is generated based on the column decoded addresses. The column selection signal may be provided to a column multiplexer, such as the column multiplexer 122, for selection of the appropriate bit lines. The selection may occur simultaneously with and/or during the same time period as the generation of the word line signal. In step 414, with the generation of the column selection signal, voltage potential of the common lines begins to separate.

In step 416, the SA enable signal 310 is generated. SA pulses 332 are generated based on rising edges of the clock signal 300, as denoted by arrows 334. The SA enable signal 310 activates a SA cell. For example, the SA enable signal 310 may activate the fifth transistor $S_{T5}$, which enables current flow through the SA cell and detection and amplification of SA bit A and/or SA bit B signals 312, 314. The SA bit A and/or SA bit B values are detected and amplified for each of the selected cells. For each cell, a first common line is pulled to voltage potential Vdd and a second common line is pulled to ground.

In step 418, the instruction output signal 318 is generated, which includes data from each of the selected cells for the current instruction. Each instruction portion of the instruction output signal 318 is generated based on the rising edges 370 of the SA enable signal 310, as denoted by arrows 372. Either a SA bit A or a SA bit B value is provided to a latch for each of the selected cells. The SA bit A or SA bit B signals 312, 314 may be inverted prior to being received by the latch. A latch signal may be generated to latch the SA bit A or SA bit B values to generate the instruction output signal.

In step 419, the word line signal 304 is deactivated or transitioned from a HIGH state to a LOW state. The deactivation of the word line signal 304 causes the potential of the bit lines to drift as a result of leakage. Over time and read cycles the potential across the bit lines decreases. In the example shown, a voltage potential of a first bit line decreases by approximately 2 mV over a 40 ns period and relative to a first original state of the first bit line, as denoted by bit line drift $BL_D$. The voltage potential of a second bit line increased toward the first bit line. The extended active word cycle provides enough bit line separation assure that there is enough bit line separation during a last read cycle along a word line.

When multiple instructions are located along a single word line, step 420 is performed. When the processor is reading a single instruction along a word line control may end.

In step 420, the instruction counter is incremented by one (1). In step 421, the column address may be advanced. The column address may be advanced linearly, successively, or in an interleaved fashion. In step 422, control determines whether the instruction counter is greater than a maximum instruction counter value. The maximum instruction counter value may be a predetermined and/or stored value. When the instruction counter is not greater than the maximum instruction counter value then step 424 is performed, otherwise control may end.

In step 423, upon detection of a rising edge of the next clock cycle, the SA enable signal 310 is transitioned from a HIGH state to a LOW state and a SA precharge signal is generated to precharge the SA common lines. The precharge for each cycle is shown by the rising edges 350 of the SA bit B signal 314 of one of the SA common lines. The rising edges 350 are based on the rising edges of the clock signal 300, as denoted by arrows 352. This illustrates potential between the SA common lines decreasing. Note that the energy used to precharge the SA common lines is less than the energy used to precharge the bit lines. For example, the energy to precharge the SA common lines may be approximately 1/10 that to precharge the bit lines. Thus, energy is saved in performing a SA precharge for each read cycle, as opposed to performing a bit line precharge for each read cycle.

In step 424, column decoding is performed to determine bit lines associated with a next instruction. Step 424 may be performed simultaneously with or during the same time period as step 422. In step 426, a next column selection signal is generated, such as one of the column selection signals 360, and voltage potential of the SA common lines begin to separate.

In step 428, the SA enable signal 310 is activated. The SA enable signal activates a SA cell. For example, the SA enable signal may activate the fifth transistor $S_{T5}$, which enables current flow through the SA cell and detection and amplification of SA bit A and SA bit B signals 312, 314 for each of the selected cells.

In step 432, the next instruction output signal is generated. Either a SA bit A or a SA bit B value is provided to a latch for each of the selected cells. The SA bit A or SA bit B signals 312m 314 may be inverted prior to being received by the latch. A latch signal may be generated to latch the SA bit A or SA bit B values to generate the instruction output signal.

As an alternative, a SA enable signal and a latch signal may be generated to acquire, amplify, and latch bit information associated with the selected instruction for a current read cycle. The sense-amplification signal may be generated to detect bit line separation for the selected cells, which provides bit information. The sense-amplification signal may be generated with the falling edges of the word line signal and the column selection signal. The bit information for each cell may be latched and provided as an output signal, denoted as instructions in the output signal.

Upon completion of step 432, the processor may return to step 420 and repeat steps 420-432 for a next instruction.

The above-described steps are meant to be illustrative examples; the steps may be performed sequentially, synchronously, simultaneously, or in a different order depending upon the application.

The wireless network devices and systems disclosed herein, may abide to IEEE standards, such as 802.11, 802.11a, 802.11b, 802.11g, 802.11h, 802.11n, 802.16, and 802.20. Also, the embodiments disclosed herein may utilize and/or incorporate Bluetooth devices and techniques.

Referring now to FIGS. 9A-9F, various exemplary implementations incorporating the teachings of the present disclosure are shown.

Figure 9A:
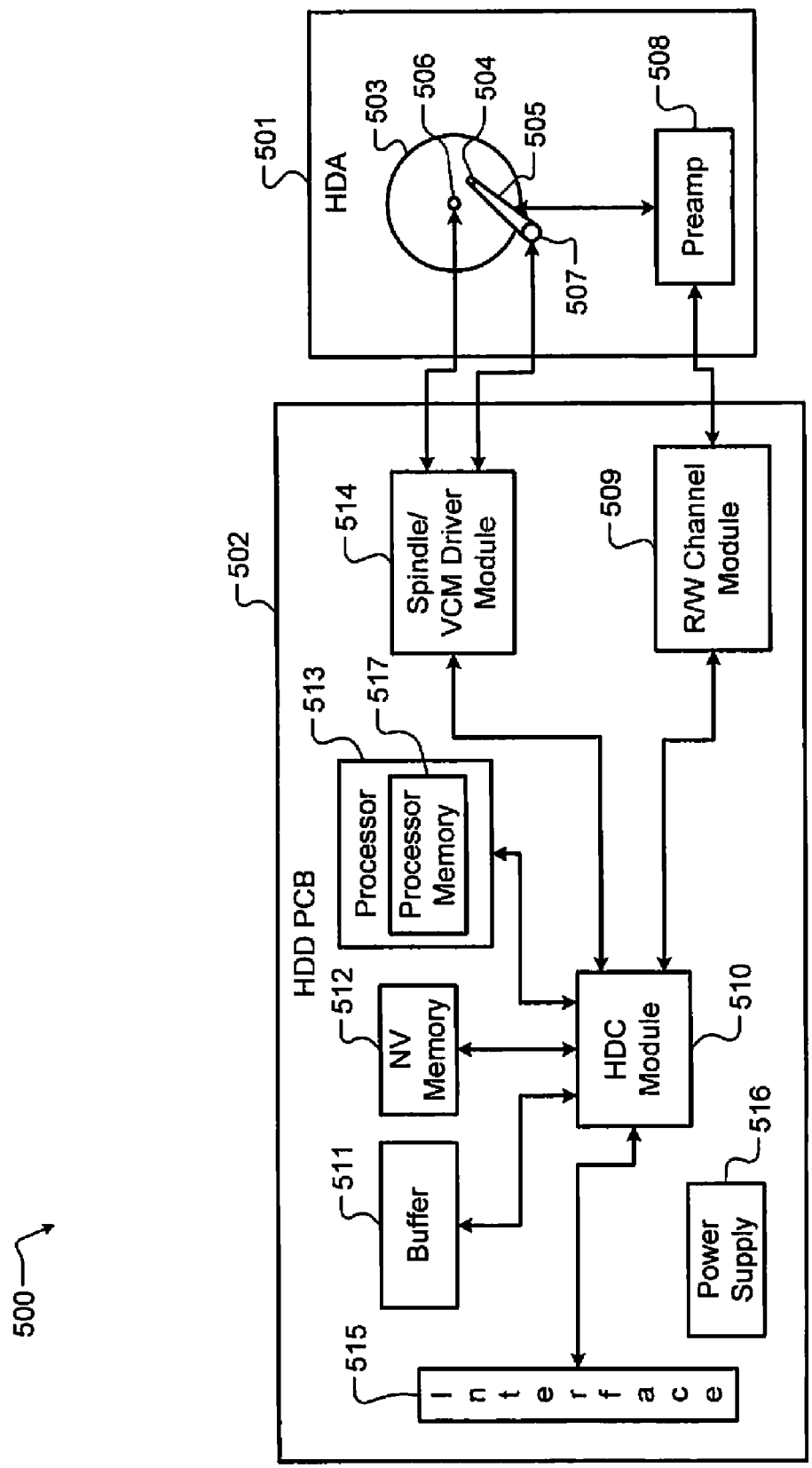
FIG. 9A is a functional block diagram of a hard disk drive.

Referring now to FIG. 9A, the teachings of the disclosure can be implemented in a processor 513 to access memory cells in a processor memory 517 of a hard disk drive (HDD) 500. The HDD 500 includes a hard disk assembly (HDA) 501 and an HDD printed circuit board (PCB) 502. The HDA 501 may include a magnetic medium 503, such as one or more platters that store data, and a read/write device 504. The read/write device 504 may be arranged on an actuator arm 505 and may read and write data on the magnetic medium 503. Additionally, the HDA 501 includes a spindle motor 506 that rotates the magnetic medium 503 and a voice-coil motor (VCM) 507 that actuates the actuator arm 505. A preamplifier device 508 amplifies signals generated by the read/write device 504 during read operations and provides signals to the read/write device 504 during write operations.

The HDD PCB 502 includes a read/write channel module (hereinafter, "read channel") 509, a hard disk controller (HDC) module 510, a buffer 511, nonvolatile memory 512, the processor 513, and a spindle/VCM driver module 514. The read channel 509 processes data received from and transmitted to the preamplifier device 508. The HDC module 510 controls components of the HDA 501 and communicates with an external device (not shown) via an I/O interface 515. The external device may include a computer, a multimedia device, a mobile computing device, etc. The I/O interface 515 may include wireline and/or wireless communication links.

The HDC module 510 may receive data from the HDA 501, the read channel 509, the buffer 511, nonvolatile memory 512, the processor 513, the spindle/VCM driver module 514, and/or the I/O interface 515. The processor 513 may process the data, including encoding, decoding, filtering, and/or formatting. The processed data may be output to the HDA 501, the read channel 509, the buffer 511, nonvolatile memory 512, the processor 513, the spindle/VCM driver module 514, and/or the I/O interface 515.

The HDC module 510 may use the buffer 511 and/or nonvolatile memory 512 to store data related to the control and operation of the HDD 500. The buffer 511 may include DRAM, SDRAM, etc. The nonvolatile memory 512 may include flash memory (including NAND and NOR flash memory), phase change memory, magnetic RAM, or multi-state memory, in which each memory cell has more than two states. The spindle/VCM driver module 514 controls the spindle motor 506 and the VCM 507. The HDD PCB 502 includes a power supply 516 that provides power to the components of the HDD 500.

Figure 9B:
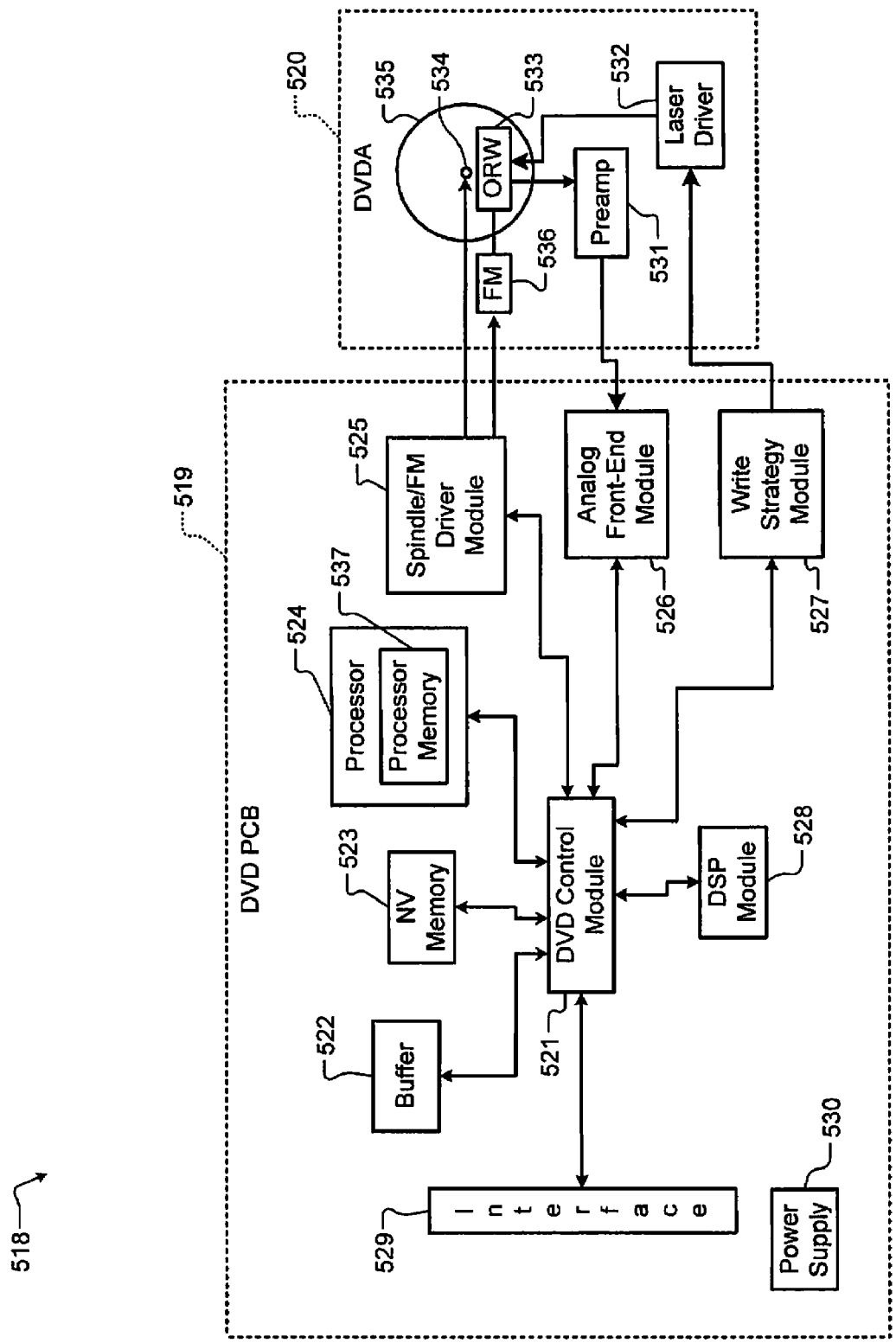
FIG. 9B is a functional block diagram of a DVD drive.

Referring now to FIG. 9B, the teachings of the disclosure can be implemented in a processor 524 to access memory cells of a processor memory 537 of a DVD drive 518 or of a CD drive (not shown). The DVD drive 518 includes a DVD PCB 519 and a DVD assembly (DVDA) 520. The DVD PCB 519 includes a DVD control module 521, a buffer 522, nonvolatile memory 523, the processor 524, a spindle/FM (feed motor) driver module 525, an analog front-end module 526, a write strategy module 527, and a DSP module 528.

The DVD control module 521 controls components of the DVDA 520 and communicates with an external device (not shown) via an I/O interface 529. The external device may include a computer, a multimedia device, a mobile computing device, etc. The I/O interface 529 may include wireline and/or wireless communication links.

The DVD control module 521 may receive data from the buffer 522, nonvolatile memory 523, the processor 524, the spindle/FM driver module 525, the analog front-end module 526, the write strategy module 527, the DSP module 528, and/or the I/O interface 529. The processor 524 may process the data, including encoding, decoding, filtering, and/or formatting. The DSP module 528 performs signal processing, such as video and/or audio coding/decoding. The processed data may be output to the buffer 522, nonvolatile memory 523, the processor 524, the spindle/FM driver module 525, the analog front-end module 526, the write strategy module 527, the DSP module 528, and/or the I/O interface 529.

The DVD control module 521 may use the buffer 522 and/or nonvolatile memory 523 to store data related to the control and operation of the DVD drive 518. The buffer 522 may include DRAM, SDRAM, etc. The nonvolatile memory 523 may include flash memory (including NAND and NOR flash memory), phase change memory, magnetic RAM, or multi-state memory, in which each memory cell has more than two states. The DVD PCB 519 includes a power supply 530 that provides power to the components of the DVD drive 518.

The DVDA 520 may include a preamplifier device 531, a laser driver 532, and an optical device 533, which may be an optical read/write (ORW) device or an optical read-only (OR) device. A spindle motor 534 rotates an optical storage medium 535, and a feed motor 536 actuates the optical device 533 relative to the optical storage medium 535.

When reading data from the optical storage medium 535, the laser driver provides a read power to the optical device 533. The optical device 533 detects data from the optical storage medium 535, and transmits the data to the preamplifier device 531. The analog front-end module 526 receives data from the preamplifier device 531 and performs such functions as filtering and ND conversion. To write to the optical storage medium 535, the write strategy module 527 transmits power level and timing data to the laser driver 532. The laser driver 532 controls the optical device 533 to write data to the optical storage medium 535.

Figure 9D:
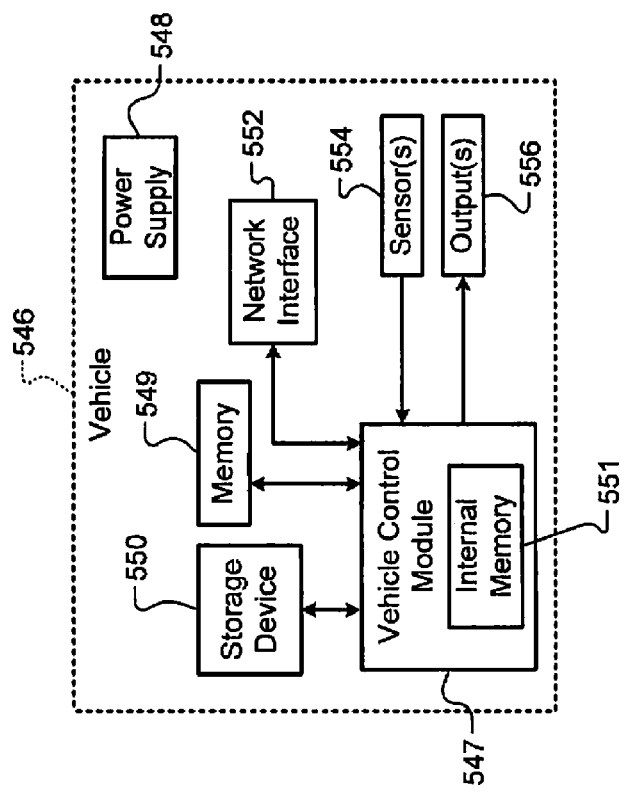
FIG. 9D is a functional block diagram of a vehicle control system.
Figure 9C:
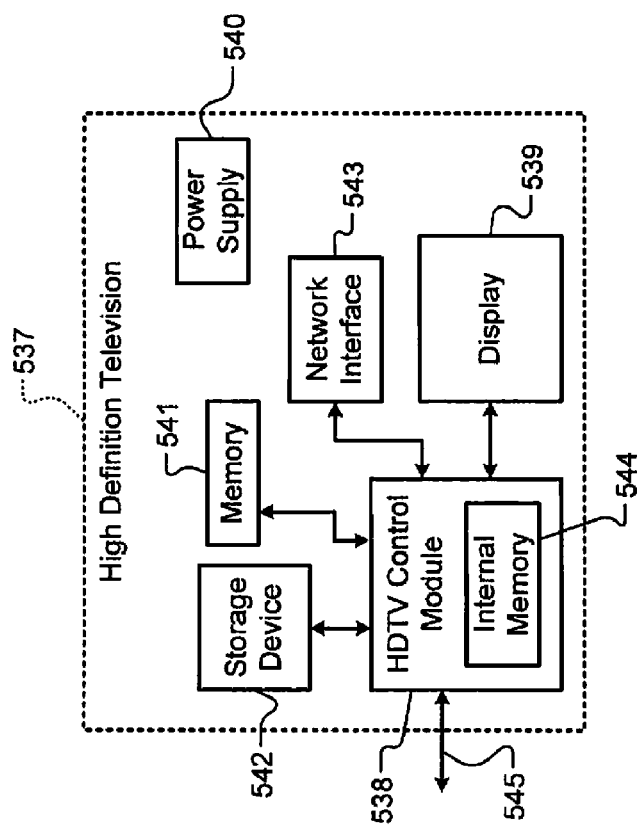
FIG. 9C is a functional block diagram of a high definition television.

Referring now to FIG. 9C, the teachings of the disclosure can be implemented in a HDTV control module 538 to access memory cells of an internal memory 544 of a high definition television (HDTV) 537. The HDTV 537 includes the HDTV control module 538, a display 539, a power supply 540, memory 541, a storage device 542, a network interface 543, and an external interface 545. If the network interface 543 includes a wireless local area network interface, an antenna (not shown) may be included.

The HDTV 537 can receive input signals from the network interface 543 and/or the external interface 545, which can send and receive data via cable, broadband Internet, and/or satellite. The HDTV control module 538 may process the input signals, including encoding, decoding, filtering, and/or formatting, and generate output signals. The output signals may be communicated to one or more of the display 539, memory 541, the storage device 542, the network interface 543, and the external interface 545.

Memory 541 may include random access memory (RAM) and/or nonvolatile memory such as flash memory, phase change memory, or multi-state memory, in which each memory cell has more than two states. The storage device 542 may include an optical storage drive, such as a DVD drive, and/or a hard disk drive (HDD). The HDTV control module 538 communicates externally via the network interface 543 and/or the external interface 545. The power supply 540 provides power to the components of the HDTV 537.

Referring now to FIG. 9D, the teachings of the disclosure may be implemented in a vehicle control module 547 to access memory cells of an internal memory 551 of a vehicle 546. The vehicle 546 may include the vehicle control module 547, a power supply 548, memory 549, a storage device 550, and a network interface 552. If the network interface 552 includes a wireless local area network interface, an antenna (not shown) may be included. The vehicle control module 547 may be a powertrain control system, a body control system, an entertainment control system, an anti-lock braking system (ABS), a navigation system, a telematics system, a lane departure system, an adaptive cruise control system, etc.

The vehicle control module 547 may communicate with one or more sensors 554 and generate one or more output signals 556. The sensors 554 may include temperature sensors, acceleration sensors, pressure sensors, rotational sensors, airflow sensors, etc. The output signals 556 may control engine operating parameters, transmission operating parameters, suspension parameters, etc.

The power supply 548 provides power to the components of the vehicle 546. The vehicle control module 547 may store data in memory 549 and/or the storage device 550. Memory 549 may include random access memory (RAM) and/or nonvolatile memory such as flash memory, phase change memory, or multi-state memory, in which each memory cell has more than two states. The storage device 550 may include an optical storage drive, such as a DVD drive, and/or a hard disk drive (HDD). The vehicle control module 547 may communicate externally using the network interface 552.

Figure 9F:
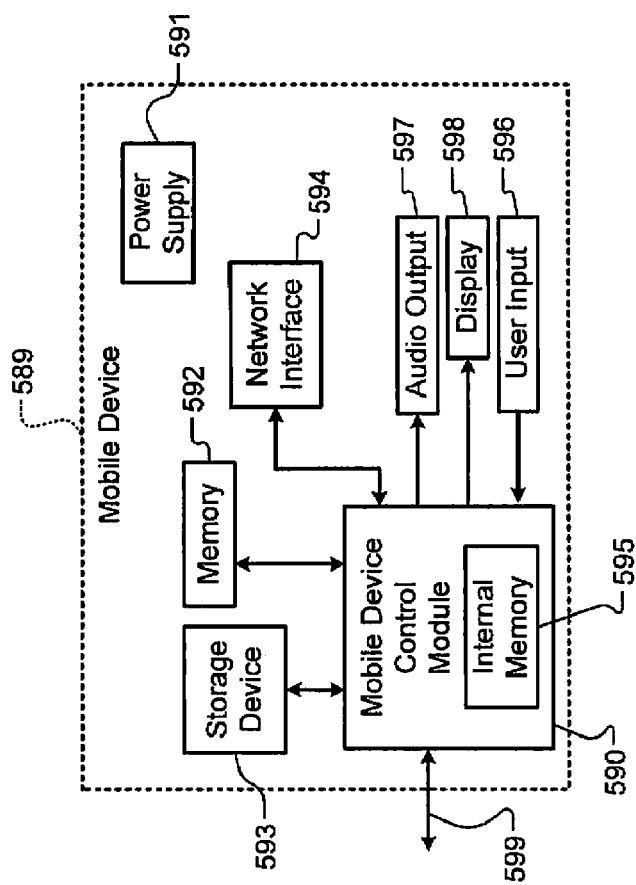
FIG. 9F is a functional block diagram of a mobile device.
Figure 9E:
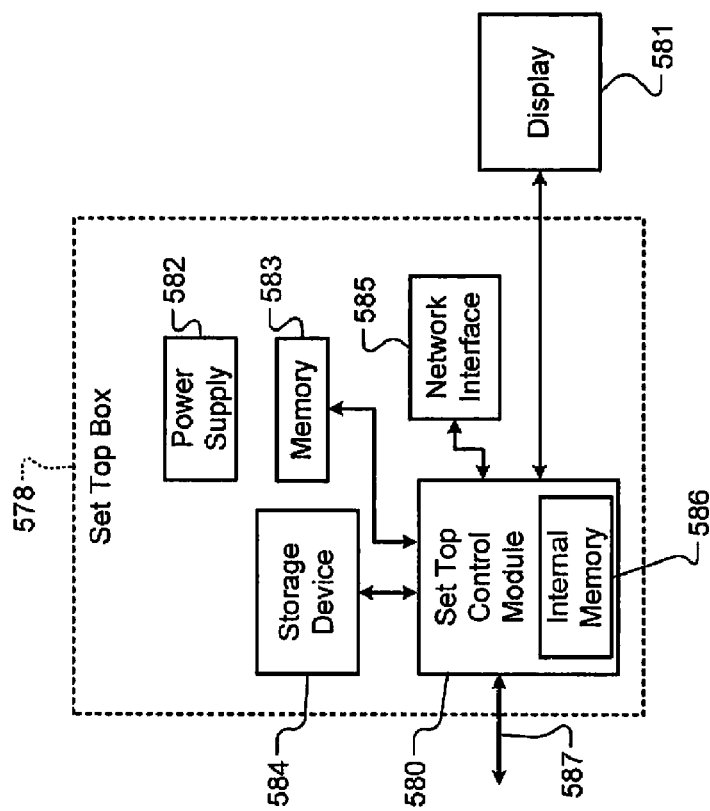
FIG. 9E is a functional block diagram of a set top box.

Referring now to FIG. 9E, the teachings of the disclosure can be implemented in a set top control module 580 to access memory cells of an internal memory 586 of a set top box 578. The set top box 578 includes the set top control module 580, a display 581, a power supply 582, memory 583, a storage device 584, and a network interface 585. If the network interface 585 includes a wireless local area network interface, an antenna (not shown) may be included.

The set top control module 580 may receive input signals from the network interface 585 and an external interface 587, which can send and receive data via cable, broadband Internet, and/or satellite. The set top control module 580 may process signals, including encoding, decoding, filtering, and/or formatting, and generate output signals. The output signals may include audio and/or video signals in standard and/or high definition formats. The output signals may be communicated to the network interface 585 and/or to the display 581. The display 581 may include a television, a projector, and/or a monitor.

The power supply 582 provides power to the components of the set top box 578. Memory 583 may include random access memory (RAM) and/or nonvolatile memory such as flash memory, phase change memory, or multi-state memory, in which each memory cell has more than two states. The storage device 584 may include an optical storage drive, such as a DVD drive, and/or a hard disk drive (HDD).

Referring now to FIG. 9F, the teachings of the disclosure can be implemented in a mobile device control module 590 to access memory cells of an internal memory 595 of a mobile device 589. The mobile device 589 may include the mobile device control module 590, a power supply 591, memory 592, a storage device 593, a network interface 594, and an external interface 599. If the network interface 594 includes a wireless local area network interface, an antenna (not shown) may be included.

The mobile device control module 590 may receive input signals from the network interface 594 and/or the external interface 599. The external interface 599 may include USB, infrared, and/or Ethernet. The input signals may include compressed audio and/or video, and may be compliant with the MP3 format. Additionally, the mobile device control module 590 may receive input from a user input 596 such as a keypad, touchpad, or individual buttons. The mobile device control module 590 may process input signals, including encoding, decoding, filtering, and/or formatting, and generate output signals.

The mobile device control module 590 may output audio signals to an audio output 597 and video signals to a display 598. The audio output 597 may include a speaker and/or an output jack. The display 598 may present a graphical user interface, which may include menus, icons, etc. The power supply 591 provides power to the components of the mobile device 589. Memory 592 may include random access memory (RAM) and/or nonvolatile memory such as flash memory, phase change memory, or multi-state memory, in which each memory cell has more than two states. The storage device 593 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A processor comprising:
a memory that comprises an array of cells; and
a control module configured to
determine a number of access cycles along a first word line,
determine an extended period based on the number of the access cycles,
generate a word line signal to maintain the first word line in an activated state during (i) an initial period and (ii) the extended period,
access a first cell during the extended period, wherein the first cell is connected to the first word line,
deactivate the word line, and
maintain the first word line in a deactivated state while accessing a second cell connected to the first word line, wherein the accessing of the second cell is based on a bit line separation provided during the extended period.

2. The processor of claim 1, wherein a read accuracy of a bit value during the accessing of the second cell is based on the bit line separation provided during the extended period.

3. The processor of claim 1, wherein the control module is configured to:
maintain the first word line in the activated state during a first one of the access cycles to provide a bit line separation for a remainder of the access cycles; and
deactivate the first word line during the remainder of the access cycles.

4. The processor of claim 1, the control module is configured to:
generate the word line signal based on a first pulse of a clock signal; and
deactivate the word line signal prior to a second pulse of the clock signal,
wherein the first pulse and the second pulse are consecutively generated.

5. The processor of claim 4, the control module is configured to:
generate the word line signal (i) subsequent to a rising edge of the first pulse and (ii) prior to a falling edge of the first pulse; and
deactivate the word line signal subsequent to the first pulse.

6. The processor of claim 1, wherein:
the control module is configured to generate the word line signal subsequent to a rising edge of a first pulse of a clock signal;
the extended period begins subsequent to a falling edge of the first pulse of the clock signal; and
the extended period ends prior to a rising edge of a second pulse of the clock signal.

7. The processor of claim 1, wherein the extended period:
begins when a sense amplification pulse is generated; and
ends prior to an end of the sense amplification pulse,
wherein the processor further comprises a sense module configured to detect a bit value in the first cell based on the sense amplification pulse.

8. The processor of claim 7, wherein the sense amplification pulse is generated (i) based on a clock pulse and (ii) at an end of the initial period.

9. The processor of claim 8, further comprising a latch configured to generate the sense amplification pulse, wherein the latch comprises the control module.

10. The processor of claim 1, further comprising:
a latch configured to generate a sense amplification pulse for each of the access cycles; and a sense module configured to detect bit values in cells connected to the first word line based on the sense amplification pulses.

11. The processor of claim 10, wherein:
the latch is configured to generate a precharge signal to precharge sense amplification common lines of the memory;
pulses of the precharge signal are generated to initiate precharging of the sense amplification common lines; and
each of the pulses of the precharge signal is generated prior to a respective one of the sense amplification pulses.

12. The processor of claim 1, wherein the control module is configured to:
perform one of a first sequential read and a first discrete read to access instructions in a first set of the cells connected to the first word line; and
perform one of a second sequential read and a second discrete read based on a first branch instruction to access instructions in a second set of the cells connected to a second word line of the memory,
wherein the first word line is different from the second word line.

13. The processor of claim 1, wherein the control module is configured to:
determine the bit line separation based on the number of the access cycles; and
precharge bit lines of the memory to provide the bit line separation when accessing cells connected to the first word line.

14. The processor of claim 13, wherein the control module is configured to:
precharge bit lines connected to the first word line to provide the bit line separation when accessing a first set of the cells, and
refrain from precharging selected ones of the bit lines when accessing a second set of the cells based on connections between the second set of the cells and the first word line.

15. The processor of claim 14, wherein the control module is configured to:
refrain from precharging the selected ones of the bit lines when the second set of the cells is connected to the first word line; and
precharges the selected ones of the bit lines when the second set of the cells is connected to a word line other than the first word line.

16. The processor of claim 1, wherein the control module is configured to:
when accessing cells connected to the first word line in a first mode, (i) precharge bit lines connected to the first word line for each of the access cycles and (ii) perform row address decoding for each of the access cycles, and
when accessing the cells connected to the first word line in a second mode, (i) precharge the bit lines for a first access cycle, (ii) perform row address decoding for the first access cycle, (iii) refrain from precharging the bit lines for a second access cycle, and (iv) refrain from performing row address decoding for the second access cycle.

17. A method comprising:
determining a number of access cycles along a word line of a memory;
determining an extended period based on the number of the access cycles;
generating a word line signal to maintain the word line in an activated state during (i) an initial period and (ii) the extended period;
accessing a first cell of an array of cells of the memory during the extended period, wherein the first cell is connected to the word line;
deactivating the word line; and
maintaining the word line in a deactivated state while accessing a second cell connected to the word line, wherein the accessing of the second cell is based on the bit line separation provided during the extended period.

18. The method of claim 17, wherein a read accuracy of a bit value during the accessing of the second cell is based on the bit line separation provided during the extended period.

19. The method of claim 17, further comprising:
maintaining the word line in the activated state during a first one of the access cycles to provide bit line separation for a remainder of the access cycles; and
deactivating the word line during the remainder of the access cycles.

* * * * *